United States Patent
Eckberg et al.

(10) Patent No.: US 8,804,334 B2
(45) Date of Patent: Aug. 12, 2014

(54) MULTI-RACK, DOOR-MOUNTED HEAT EXCHANGER

(75) Inventors: Eric A. Eckberg, Rochester, MN (US); David P. Graybill, Staatsburg, NY (US); Madhusudan K. Iyengar, Woodstock, NY (US); Howard V. Mahaney, Jr., Cedar Park, TX (US); Roger R. Schmidt, Poughkeepsie, NY (US); Kenneth R. Schneebeli, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 236 days.

(21) Appl. No.: 13/115,404

(22) Filed: May 25, 2011

(65) Prior Publication Data

US 2012/0300398 A1 Nov. 29, 2012

(51) Int. Cl.
*H05K 7/20* (2006.01)
*B23P 15/26* (2006.01)

(52) U.S. Cl.
CPC .......... *H05K 7/2079* (2013.01); *H05K 7/20818* (2013.01); *H05K 7/20718* (2013.01); *B23P 15/26* (2013.01)
USPC . 361/696; 361/692; 361/679.48; 361/679.49; 165/104.33; 454/184

(58) Field of Classification Search
CPC ............ H05K 7/2079; H05K 7/20818; H05K 7/20718; B23P 15/26
USPC ........................ 361/692, 696, 679.48, 679.49; 165/80.2, 104.33; 454/184
See application file for complete search history.

(56) References Cited

U.S. PATENT DOCUMENTS

| 3,317,798 A | 5/1967 | Chu et al. |
| 4,108,240 A | 8/1978 | Margen et al. |

(Continued)

FOREIGN PATENT DOCUMENTS

| GB | 2436669 B | 5/2011 |
| JP | 2010-079619 A | 3/2010 |

(Continued)

OTHER PUBLICATIONS

Ellsworth, Jr. et al., "The Evolution of Water Cooling for IBM Larger Server Systems: Back to the Future", IEEE, Piscataway, NJ, 2008 11th Intersociety Conference on Thermal and Thermomechanical Phenomena in Electronic Systems (ITHERM '08), pp. 266-274 (May 2008).

(Continued)

*Primary Examiner* — Anatoly Vortman
(74) *Attorney, Agent, or Firm* — Dennis Jung, Esq.; Kevin P. Radigan, Esq.; Heslin Rothenberg Farley & Mesiti P.C.

(57) ABSTRACT

An air-cooling apparatus is provided which includes a securing mechanism for holding two or more separate electronics racks in fixed relation adjacent to each other, and a multi-rack door sized and configured to span the air inlet or air outlet sides of the racks. The securing mechanism holds the electronics racks in fixed relation with their air inlet sides facing a first direction, and air outlet sides facing a second direction. The door includes a door frame with an airflow opening. The airflow opening facilitates the ingress or egress of airflow through the electronics racks, and the door further includes an air-to-liquid heat exchanger supported by the door frame, and disposed so that air flowing through the airflow opening passes across the heat exchanger. In operation, the heat exchanger extracts heat from the air passing through the separate electronics racks.

8 Claims, 13 Drawing Sheets

(56) References Cited

U.S. PATENT DOCUMENTS

| | | | |
|---|---|---|---|
| 5,150,277 A | 9/1992 | Bainbridge et al. | |
| 5,181,392 A | 1/1993 | Itoh et al. | |
| 5,228,197 A | 7/1993 | Cox et al. | |
| 5,467,250 A | 11/1995 | Howard et al. | |
| 5,467,609 A | 11/1995 | Feeney | |
| 6,012,220 A | 1/2000 | Cornejo | |
| 6,164,369 A | 12/2000 | Stoller | |
| 6,704,198 B2 | 3/2004 | Replogle et al. | |
| 6,775,137 B2* | 8/2004 | Chu et al. | 361/696 |
| 6,819,563 B1 | 11/2004 | Chu et al. | |
| 6,924,981 B2 | 8/2005 | Chu et al. | |
| 7,283,358 B2* | 10/2007 | Campbell et al. | 361/694 |
| 7,286,351 B2* | 10/2007 | Campbell et al. | 361/696 |
| 7,312,993 B2 | 12/2007 | Bundza et al. | |
| 7,342,789 B2 | 3/2008 | Hall et al. | |
| 7,385,810 B2 | 6/2008 | Chu et al. | |
| 7,397,661 B2* | 7/2008 | Campbell et al. | 361/696 |
| 7,477,512 B2 | 1/2009 | Sung | |
| 7,630,795 B2* | 12/2009 | Campbell et al. | 700/300 |
| 7,639,486 B2 | 12/2009 | Champion et al. | |
| 7,660,109 B2* | 2/2010 | Iyengar et al. | 361/679.47 |
| 7,660,116 B2 | 2/2010 | Classen et al. | |
| 7,660,117 B2 | 2/2010 | Werner et al. | |
| 7,660,121 B2 | 2/2010 | Campbell et al. | |
| 7,757,506 B2* | 7/2010 | Ellsworth et al. | 62/259.2 |
| 7,832,925 B2* | 11/2010 | Archibald et al. | 374/29 |
| 7,963,118 B2* | 6/2011 | Porter et al. | 62/259.2 |
| 8,250,877 B2* | 8/2012 | Correa et al. | 62/259.2 |
| 2005/0237714 A1 | 10/2005 | Ebermann | |
| 2006/0037736 A1 | 2/2006 | Heyman | |
| 2006/0065000 A1 | 3/2006 | Belady | |
| 2007/0117502 A1* | 5/2007 | Kim | 454/139 |
| 2008/0018212 A1* | 1/2008 | Spearing et al. | 312/236 |
| 2008/0060790 A1 | 3/2008 | Yates et al. | |
| 2008/0123288 A1 | 5/2008 | Hillis | |
| 2008/0148746 A1 | 6/2008 | Yanik et al. | |
| 2008/0198549 A1 | 8/2008 | Rasmussen et al. | |
| 2008/0232064 A1 | 9/2008 | Sato et al. | |
| 2009/0046423 A1 | 2/2009 | Hom et al. | |
| 2009/0046430 A1* | 2/2009 | Brewer et al. | 361/701 |
| 2009/0080173 A1 | 3/2009 | Porter et al. | |
| 2009/0086432 A1 | 4/2009 | Campbell et al. | |
| 2009/0122483 A1 | 5/2009 | Hall | |
| 2009/0126909 A1 | 5/2009 | Ellsworth, Jr. et al. | |
| 2009/0207567 A1 | 8/2009 | Campbell et al. | |
| 2009/0225514 A1 | 9/2009 | Correa et al. | |
| 2009/0241578 A1 | 10/2009 | Carlson et al. | |
| 2009/0259343 A1 | 10/2009 | Rasmussen et al. | |
| 2009/0260384 A1 | 10/2009 | Champion et al. | |
| 2009/0262501 A1* | 10/2009 | Claassen et al. | 361/701 |
| 2010/0027216 A1 | 2/2010 | Matsushuima et al. | |
| 2010/0053879 A1 | 3/2010 | Miyamoto et al. | |
| 2011/0051372 A1 | 3/2011 | Barringer et al. | |
| 2011/0297351 A1* | 12/2011 | Vosper et al. | 165/67 |
| 2013/0019627 A1 | 1/2013 | Yoshikawa et al. | |

FOREIGN PATENT DOCUMENTS

| | | |
|---|---|---|
| WO | WO 97/47167 A1 | 12/1997 |
| WO | WO 02/37918 A1 | 5/2002 |
| WO | 2010/112873 A | 10/2010 |

OTHER PUBLICATIONS

Eckberg et al., Office Action for U.S. Appl. No. 13/115,390, filed May 25, 2011 (U.S. Patent Publication No. 2012/0298335 A1), dated Mar. 27, 2013.

Eckberg et al., Final Office Action for U.S. Appl. No. 13/115,390, filed May 25, 2011 (U.S. Patent Publication No. 2012/0298335 A1), dated Jul. 26, 2013 (28 pgs).

Eckberg et al., Office Action for U.S. Appl. No. 13/115,390, filed May 25, 2011 (U.S. Patent Publication No. 2012/0298335 A1), dated Apr. 24, 2014 (20 pages).

* cited by examiner

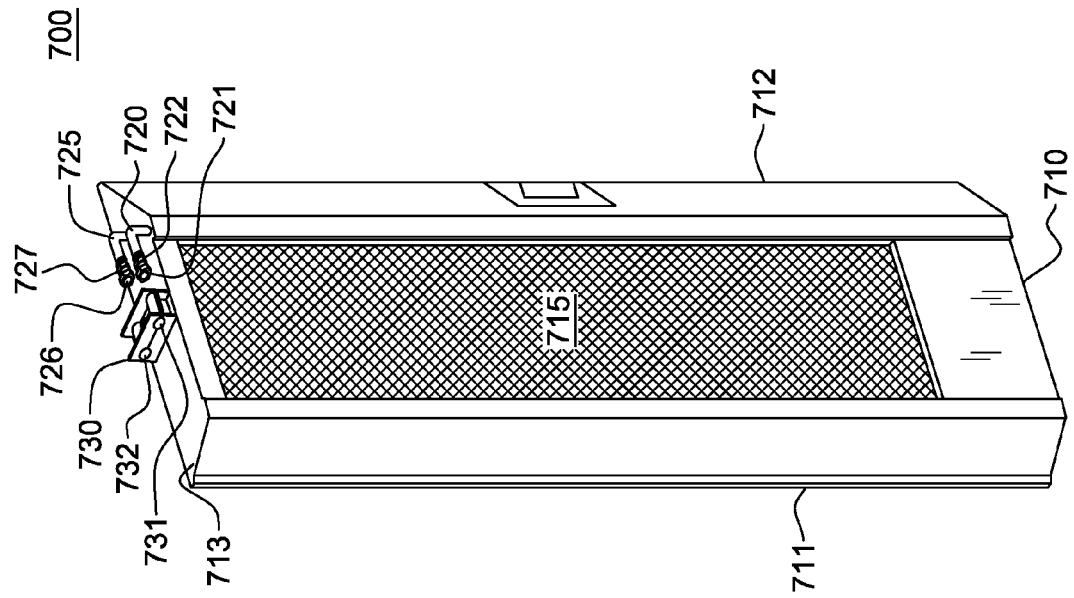
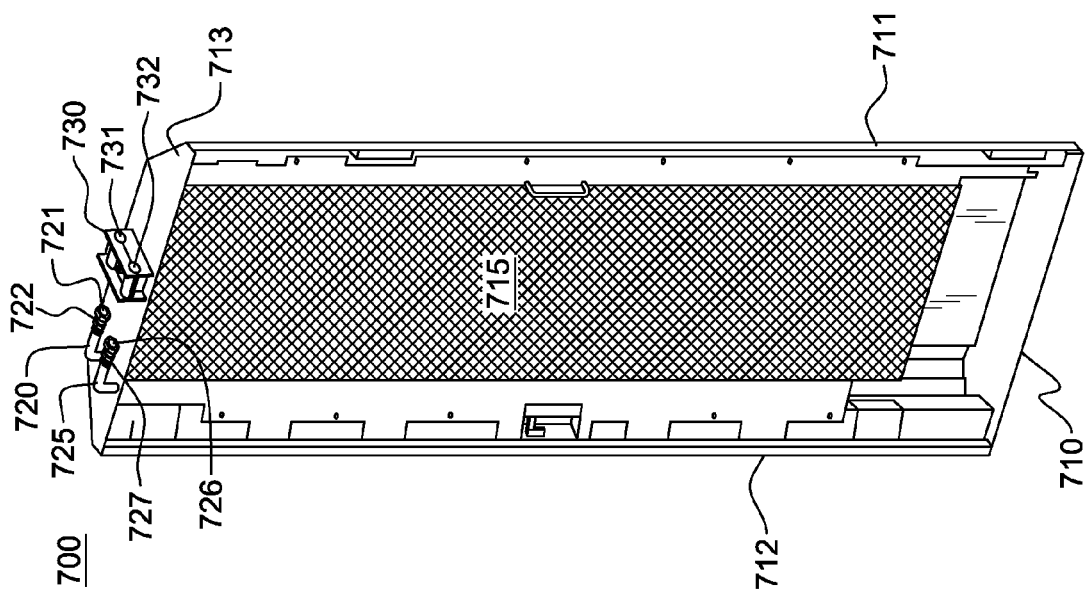
FIG. 7A
FIG. 7B

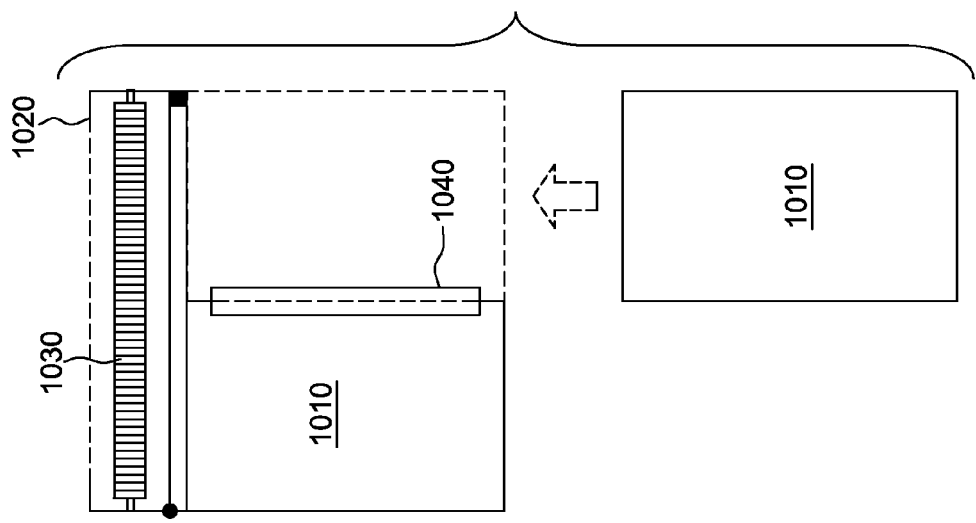
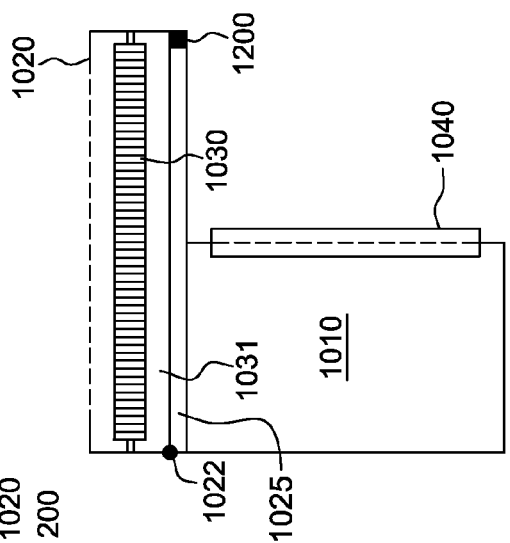
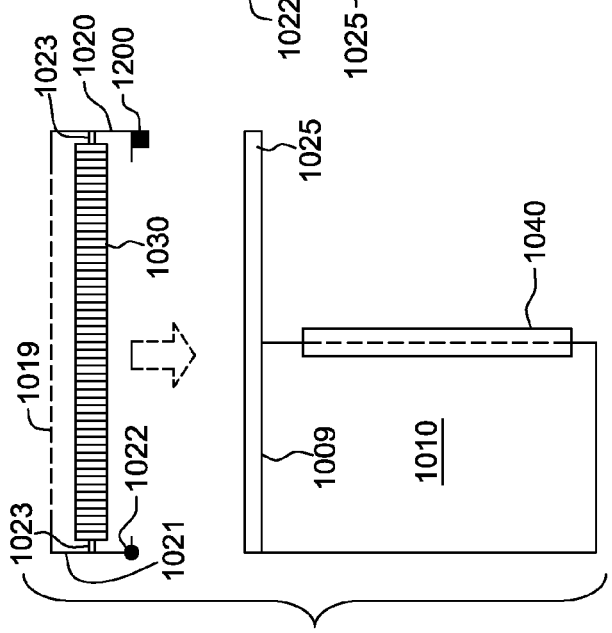
FIG. 12A
FIG. 12B
FIG. 12C

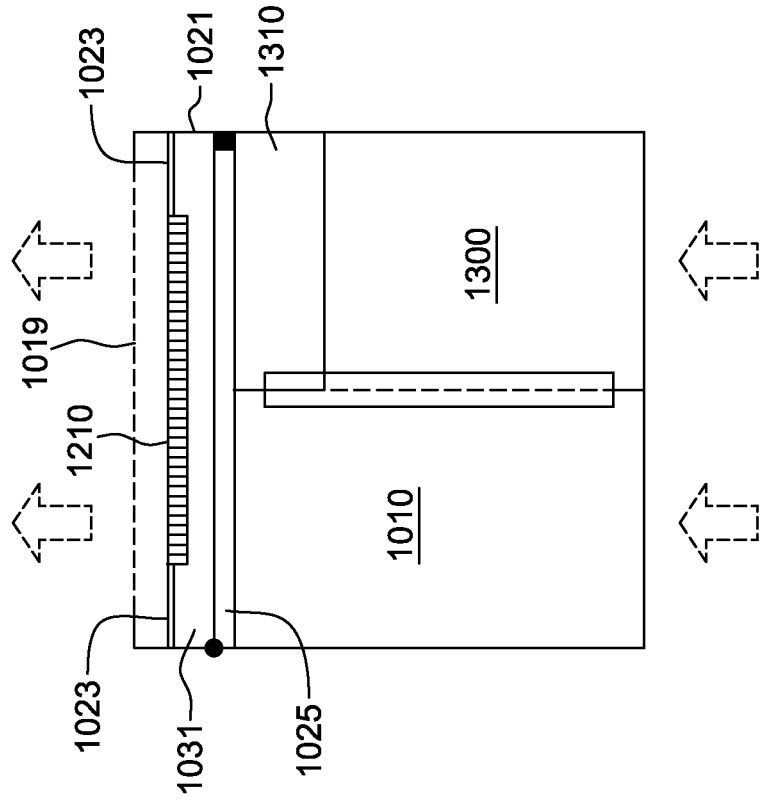
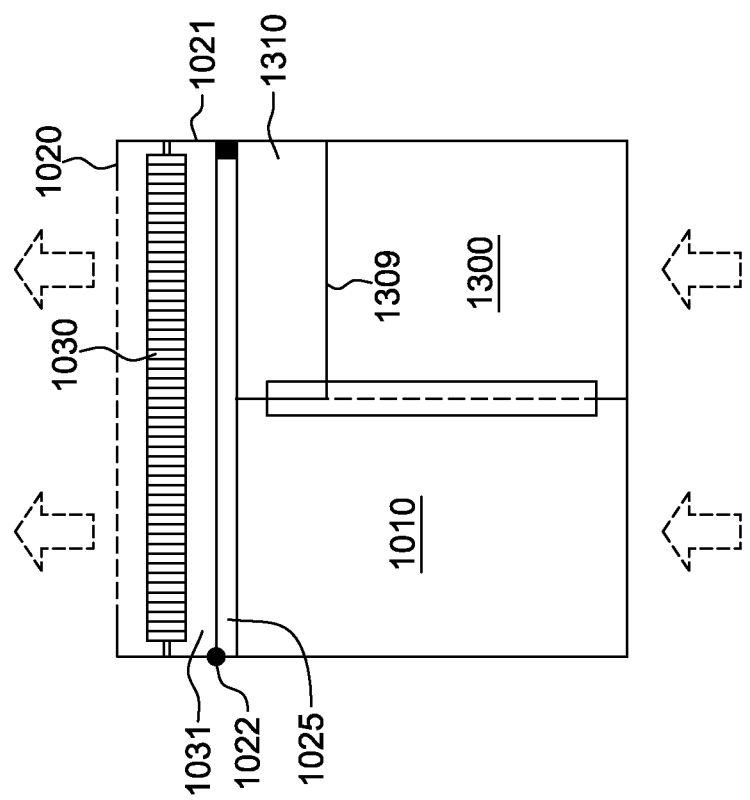
FIG. 13A
FIG. 13B

MULTI-RACK, DOOR-MOUNTED HEAT EXCHANGER

BACKGROUND

The power dissipation of integrated circuit chips, and the modules containing the chips, continues to increase in order to achieve increases in processor performance. This trend poses a cooling challenge at both module and system levels. Increased airflow rates are needed to effectively cool high-powered modules, and to limit the temperature of the air that is exhausted into the computer center.

In many large server applications, processors, along with their associated electronics (e.g., memory, disk drives, power supplies, etc.), are packaged in removable drawer configurations stacked within a rack or frame. In other cases, the electronics may be in fixed locations within the rack or frame. Typically, the components are cooled by air moving in parallel airflow paths, usually front-to-back, impelled by one or more air-moving devices (e.g., fans or blowers). In some cases, it may be possible to handle increased power dissipation within a single drawer by providing greater airflow, through the use of a more powerful air-moving device, or by increasing the rotational speed (i.e., RPMs) of an existing air-moving device. However, this approach is becoming problematic at the rack level in the context of a computer installation (i.e., data center).

The sensible heat load carried by the air exiting the rack is stressing the capability of the room air-conditioning to effectively handle the load. This is especially true for large installations with "server farms", or large banks of computer racks close together. In such installations, liquid-cooling (e.g., water-cooling) is an attractive technology to manage the higher heat fluxes. The liquid absorbs the heat dissipated by the components/modules in an efficient manner. Typically, the heat is ultimately transferred from the liquid to an outside environment, whether to air or other liquid.

BRIEF SUMMARY

The shortcomings of the prior art are overcome and additional advantages are provided through the provision of an air-cooling apparatus for facilitating cooling of airflow passing through multiple electronics racks. The apparatus includes a securing mechanism for holding at least two separate electronics racks in fixed relation adjacent to each other, and a multi-rack door sized and configured to span one of the air inlet sides or the air outlet sides of the at least two separate electronics racks held by the securing mechanism in fixed relation. The two separate electronics racks are at least partially air-cooled, and each has an air inlet side and an air outlet side. The securing mechanism holds the at least two separate electronics racks in fixed relation adjacent to each other with the air inlet sides facing a first direction, and the air outlet sides facing a second direction. The multi-rack door includes a door frame with an airflow opening, and an air-to-liquid heat exchanger supported by the door frame. The airflow opening of the door frame facilitates the ingress and egress of external air through the two at least separate electronics racks, and the air-to-liquid heat exchanger is disposed so that airflow through the airflow opening passes across the air-to-liquid heat exchanger. The air-to-liquid heat exchanger extracts heat from the air passing thereacross, and air passing through the one of the air inlet sides or the air outlet sides of the at least two separate electronics racks passes across the air-to-liquid heat exchanger.

In another aspect, a multi-rack assembly is provided which includes a first electronics rack, a second electronics rack, and an air-cooling apparatus for extracting heat from airflow through the first electronics rack and the second electronics rack. The first electronics rack includes at least one heat-generating electronic component, and has an air inlet side and an air outlet side respectively enabling ingress and egress of external air through the first electronics rack. The second electronics rack includes at least one heat-generating electronic component, and has an air inlet side and an air outlet side respectively enabling ingress and egress of external air through the second electronics rack. The air-cooling apparatus includes a securing mechanism for holding the first electronics rack and the second electronics rack in fixed relation adjacent to each other, and a multi-rack door sized and configured to span one of the air inlet sides or the air outlet sides of the first and second electronics racks held by the securing mechanism in fixed relation. The securing mechanism holds the first electronics rack and the second electronics rack in fixed relation adjacent to each other, with the air inlet sides facing a first direction and the air outlet sides facing a second direction. The multi-rack door includes a door frame with an airflow opening, and an air-to-liquid heat exchanger supported by the door frame. The airflow opening of the door frame facilitates the ingress and egress of external air through the first and second electronics racks, and the air-to-liquid heat exchanger is disposed so that airflow through the airflow opening passes across the air-to-liquid heat exchanger. The air-to-liquid heat exchanger extracts heat from the airflow passing thereacross, and air passing through the one of the air inlet sides or the air outlet sides of the first and second electronics racks passes across the air-to-liquid heat exchanger.

In a further aspect, a method is presented which includes: providing a securing mechanism for holding at least two separate electronics racks in fixed relation adjacent to each other, the at least two separate electronics racks being at least partially air-cooled, and each having an air inlet side and an air outlet side, the securing mechanism holding the at least two separate electronics racks in fixed relation adjacent to each other with the air inlet sides facing a first a first direction and the air outlet sides facing a second direction; and providing a multi-rack door sized and configured to span one of the air inlet sides or the air outlet sides of the at least two separate electronics racks held by the securing mechanism in fixed relation, the multi-rack door including: a door frame with an airflow opening, the airflow opening facilitating the ingress and egress of airflow through the at least two separate electronics racks; and an air-to-liquid heat exchanger supported by the door frame and disposed so that airflow through the airflow opening passes across the air-to-liquid heat exchanger, the air-to-liquid heat exchanger extracting heat from the airflow passing thereacross, and wherein air passing through the one of the air inlet sides or the air outlet sides of the at least two separate electronics racks passes across the air-to-liquid heat exchanger.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIGS. 7A & 7B depict interior and exterior views, respectively, of one embodiment of an electronics rack door having an air-to-liquid heat exchanger disposed therein, in accordance with one or more aspects of the present invention;

FIG. 12A depicts assembly of a multi-rack assembly, such as depicted in FIGS. 10 & 11, and illustrating the securing mechanism of the air-cooling apparatus secured to one electronics rack of the at least two separate electronics racks to be held in fixed relation, in accordance with one or more aspects of the present invention;

FIG. 12B depicts the assembly of FIG. 12A, after hinged securement of the multi-rack door (with the multi-rack, door-mounted heat exchanger) to the adapter frame of the securing mechanism, in accordance with one or more aspects of the present invention;

FIG. 12C depicts the assembly of FIG. 12B, and illustrates sliding engagement of a second electronics rack into fixed relation adjacent to the first electronics rack employing the slidable engagement structure disposed between the first electronics rack and the second electronics rack, in accordance with one or more aspects of the present invention;

FIG. 13A depicts an alternate embodiment of a multi-rack assembly comprising an air-cooling apparatus which includes an adapter frame holding at least two separate electronics racks disposed in fixed relation to each other, a filler frame which assists in defining a common airflow plenum at the air outlet sides of the racks of different depths, and a multi-rack, door-mounted heat exchanger, in accordance with one or more aspects of the present invention;

FIG. 13B depicts an alternate embodiment of the multi-rack assembly of FIG. 13A, wherein a smaller-sized, air-to-liquid heat exchanger is employed within the multi-rack door, in accordance with one or more aspects of the present invention.

DETAILED DESCRIPTION

Figure 1:
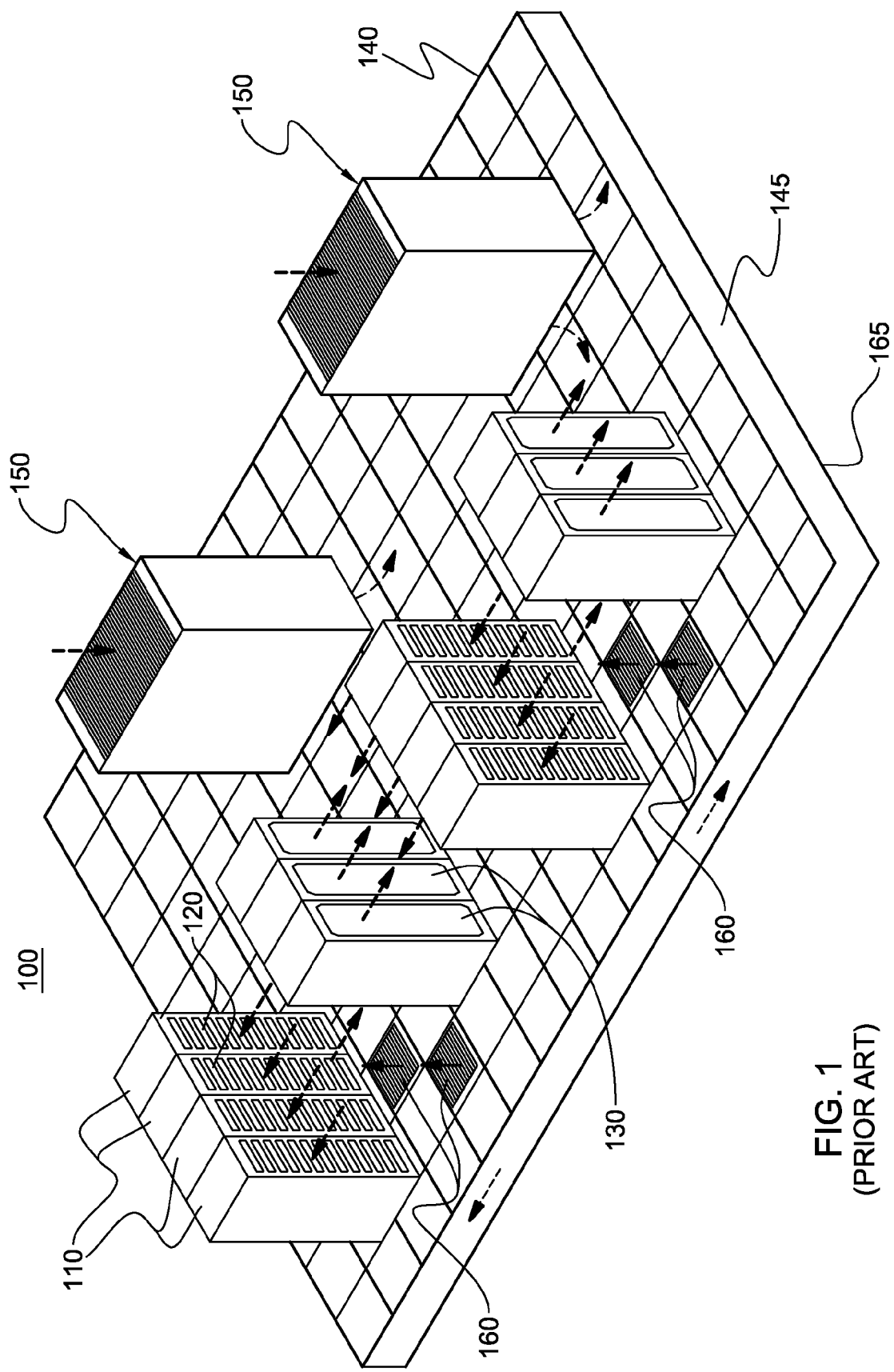
FIG. 1 depicts one embodiment of a raised floor layout of a computer installation capable of being retrofitted with one or more air-cooling apparatuses, in accordance with one or more aspects of the present invention.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with the rack-mounted electronic drawers of a multi-drawer rack unit and blades of a blade center system being two examples of systems (or subsystems) of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier.

As used herein, "air-to-liquid heat exchanger" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubings (such as copper or other tubing) in thermal or mechanical contact with a plurality of air-cooled cooling fins. Size, configuration and construction of the air-to-liquid heat exchanger can vary without departing from the scope of the invention disclosed herein. A "liquid-to-liquid heat exchanger" may comprise, for example, two or more coolant flow paths, formed of thermally conductive tubings (such as copper or other tubing) in thermal or mechanical contact with each other to facilitate conduction of heat therebetween. Size, configuration and construction of the liquid-to-liquid heat exchanger can vary without departing from the scope of the invention disclosed herein. Further, as used herein, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a fluorocarbon liquid, a liquid metal, or other similar coolant, or refrigerant, while still maintaining the advantages and unique features of the present invention.

Reference is made below to the drawings (which are not drawn to scale to facilitate understanding of the invention), wherein the same reference numbers used throughout different figures designate the same or similar components.

As shown in FIG. 1, in a raised floor layout of an air cooled computer installation or data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between a raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air-moving devices (e.g., fans or blowers) to provide forced inlet-to-outlet airflow to cool the electronic components within the rack. Supply air plenum 145 provides conditioned and cooled air to the air-inlet sides of the electronics racks via perforated floor tiles 160 disposed in a "cold" air aisle of the data center. The conditioned and cooled air is supplied to plenum 145 by one or more air-conditioning units 150, also disposed within data center 100. Room air is taken into each air-conditioning unit 150 near an upper portion thereof. This room air comprises in part exhausted air from the "hot" air aisles of the data center defined by opposing air outlet sides 130 of the electronics racks 110.

Due to the ever increasing airflow requirements through the electronics racks, and limits of air distribution within the typical computer room installation, recirculation problems within the room may occur. This recirculation can occur because the conditioned air supplied through the floor tiles may only be a fraction of the airflow rate forced through the electronics racks by the air moving devices disposed within the racks. This can be due, for example, to limitations on the tile sizes (or diffuser flow rates). The remaining fraction of the supply of inlet side air may be made up by ambient room air through recirculation, for example, from an air outlet side of a rack unit to an air inlet side. This recirculating flow is often very complex in nature, and can lead to significantly higher rack inlet temperatures than might be expected.

The recirculation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 15-32° C. range. For a raised floor layout such as depicted in FIG. 1, however, temperatures can range from 15-20° C. at the lower portion of the rack, close to the cool air floor vents, to as much as 32-42° C. at the upper portion of the electronics rack, where hot air can form a self-sustaining recirculation loop. Since the allowable rack heat load is limited by the rack inlet air temperature at the "hot" part, this temperature distribution correlates to an inefficient utilization of available air conditioning capability. Computer installation equipment almost always represents a high capital investment to the customer. Thus, it is of significant importance, from a product reliability and performance view point, and from a customer satisfaction and business perspective, to achieve a substantially uniform temperature across the air inlet side of the rack unit.

Figure 2:
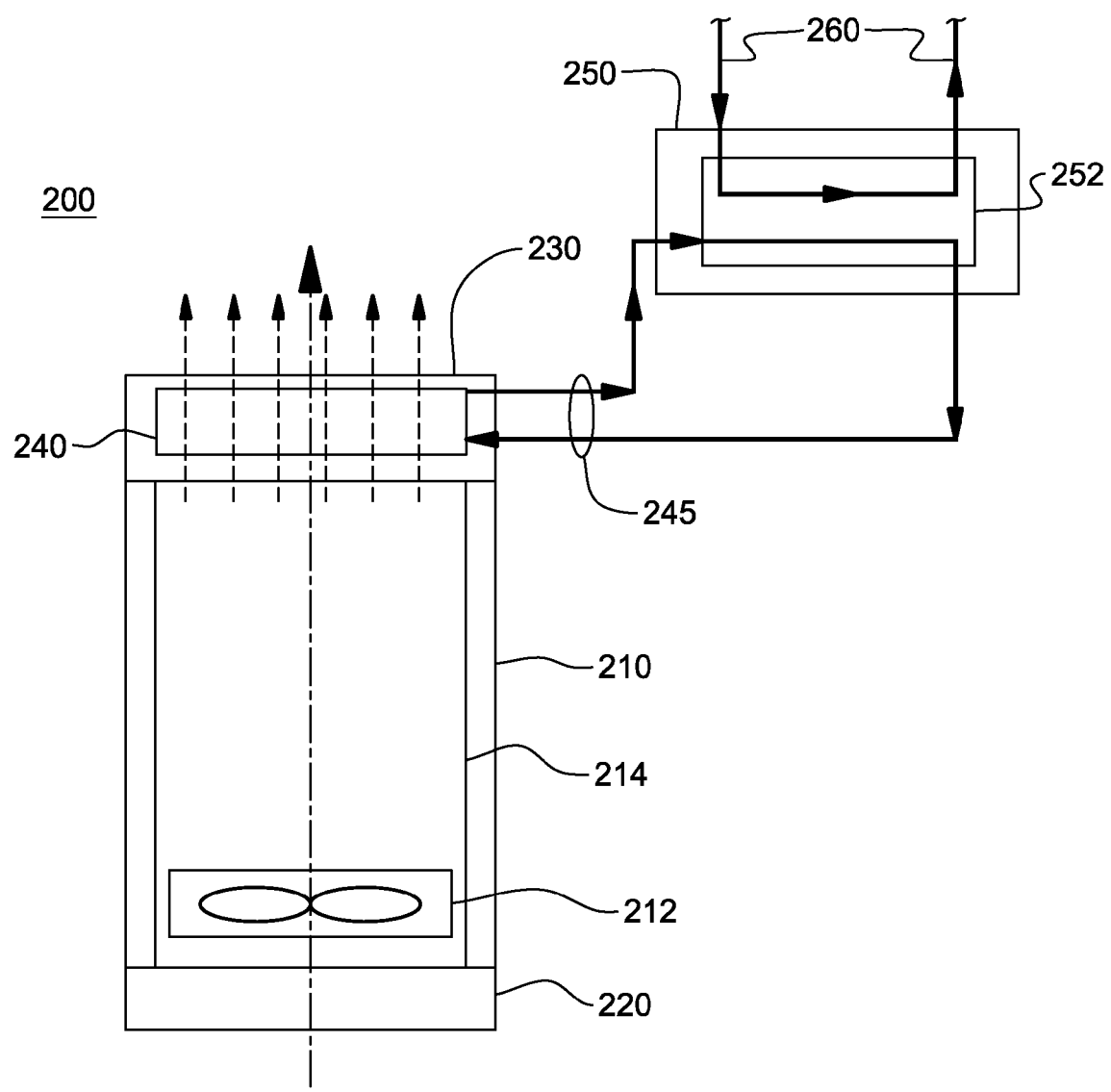
FIG. 2 is a top plan view of one embodiment of a single electronics rack with an air-to-liquid heat exchanger mounted to an outlet door thereof, and with extracted heat being rejected to facility coolant via a coolant distribution unit, in accordance with one or more aspects of the present invention.

FIG. 2 depicts one embodiment of a cooled electronic system, generally denoted 200. In this embodiment, electronic system 200 includes an electronics rack 210 having an inlet door 220 and an outlet door 230, which have openings to allow for the ingress and egress of external air, respectively, through the air inlet side and air outlet side of electronics rack 210. The system further includes at least one air-moving device 212 for moving external air across at least one electronic system or component 214 positioned within the electronics rack. Disposed within outlet door 230 is an air-to-liquid heat exchanger 240 across which the inlet-to-outlet airflow through the electronics rack passes. A coolant distribution unit 250 is used to buffer the air-to-liquid heat exchanger from facility coolant in a facility coolant loop. Air-to-liquid heat exchanger 240 removes heat from the exhausted inlet-to-outlet airflow through the electronics rack via circulating system coolant, for rejection in coolant distribution unit 250 to facility coolant in a facility coolant loop 260, that is, via a liquid-to-liquid heat exchanger 252 disposed therein. This cooling apparatus advantageously reduces heat load on existing air-conditioning units within the data center, and facilitates cooling of electronics racks by cooling the air egressing from the electronics rack and thus cooling any air recirculating to the air inlet side thereof.

As shown in FIG. 2, a system coolant loop 245 couples air-to-liquid heat exchanger 240 to coolant distribution unit 250. In one embodiment, the system coolant employed is water. By way of example, such a system is described in U.S. Pat. No. 7,385,810 B2, issued Jun. 10, 2008, and entitled "Apparatus and Method for Facilitating Cooling of an Electronics Rack Employing a Heat Exchange Assembly Mounted to an Outlet Door Cover of the Electronics Rack".

In one implementation, the inlet and outlet plenums of the air-to-liquid heat exchanger mount within the door and are coupled to coolant supply and return manifolds disposed beneath a raised floor. Alternatively, system coolant supply and return manifolds or headers for the air-to-liquid heat exchangers may be mounted overhead the electronics racks within the data center. In such an embodiment, system coolant enters and exits the respective coolant inlet and outlet plenums at the top of the rack door, using flexible coolant supply and return hoses, which are at least partially looped and are sized to facilitate opening and closing of the rack door (containing the air-to-liquid heat exchanger). Additionally, structures may be provided at the ends of the hoses to relive stress at the hose ends, which results from opening or closing of the door.

Figure 3:
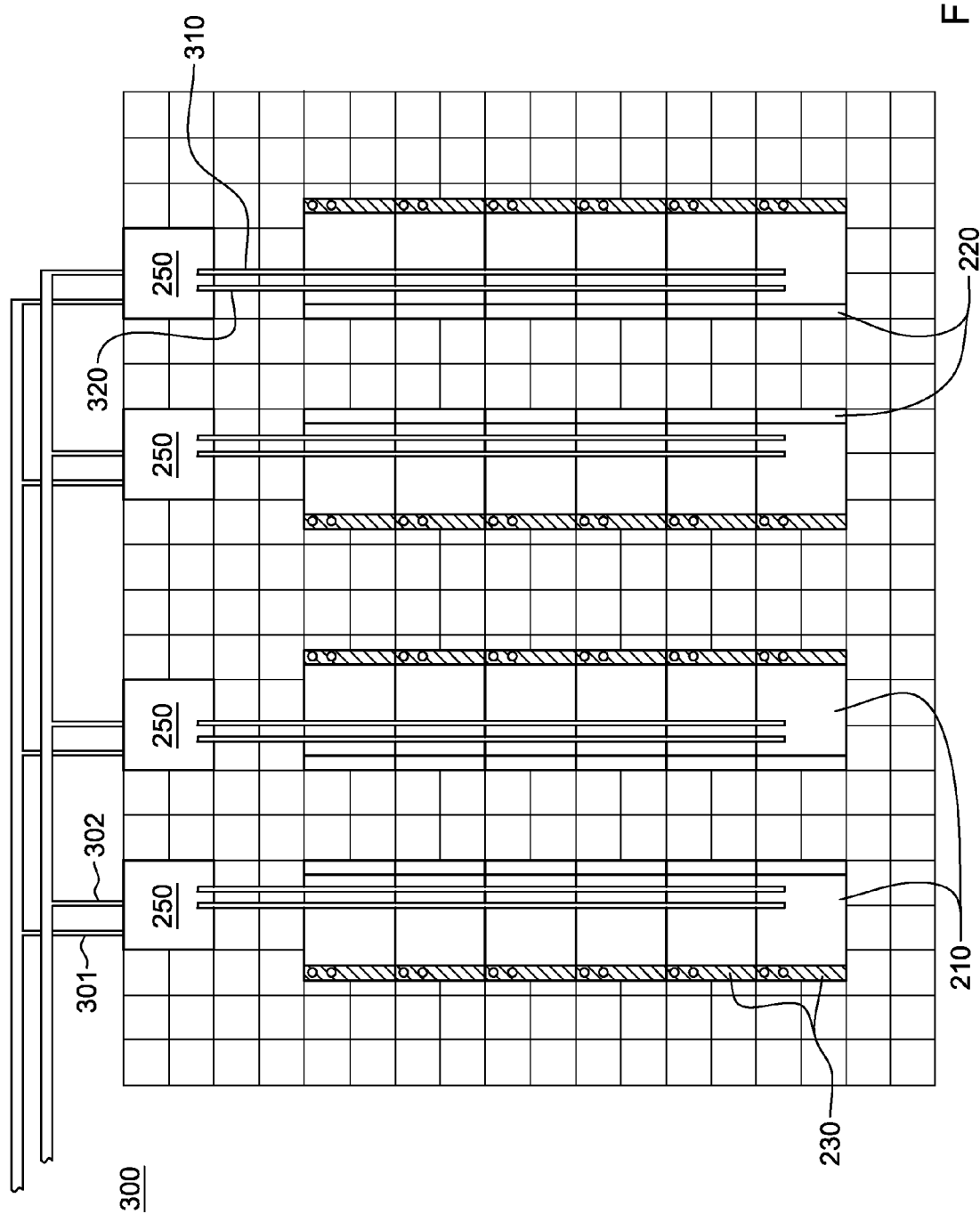
FIG. 3 depicts one embodiment of a data center layout comprising multiple coolant distribution units providing liquid coolant to a plurality of air-to-liquid heat exchangers associated with a plurality of electronics racks disposed in rows in the data center, and which is to be modified to include one or more air-cooling apparatuses, in accordance with one or more aspects of the present invention.

FIG. 3 is a plan view of one embodiment of a data center, generally denoted 300, employing cooled electronics systems. Data center 300 includes a plurality of rows of electronics racks 210, each of which includes an inlet door 220 at the air inlet side, and a hinged outlet door 230 at the air outlet side, such as described above in connection with the embodiment of FIG. 2. In this embodiment, each outlet door 230 supports an air-to-liquid heat exchanger and system coolant inlet and outlet plenums. Multiple coolant conditioning units 250, referred to hereinbelow as pumping units, are disposed within the data center (along with one or more air-conditioning units (not shown)). As shown, in one embodiment, each pumping unit forms a system coolant distribution subsystem with one row of a plurality of electronics racks. Each pumping unit includes a liquid-to-liquid heat exchanger where heat is transferred from a system coolant loop to a facility coolant loop. Chilled facility coolant, such as water, is received via facility coolant supply line 301, and is returned via facility coolant return line 302. System coolant, such as water, is provided via a system coolant supply header 310 extending over the respective row of electronics racks, and is returned via a system coolant return header 320 also extending over the respective row of electronics racks. In one embodiment, the system coolant supply and return headers 310, 320 are hard-plumbed within the data center, and preconfigured to align over and include branch lines extending towards electronics racks in a respective row of electronics racks.

Figure 4:
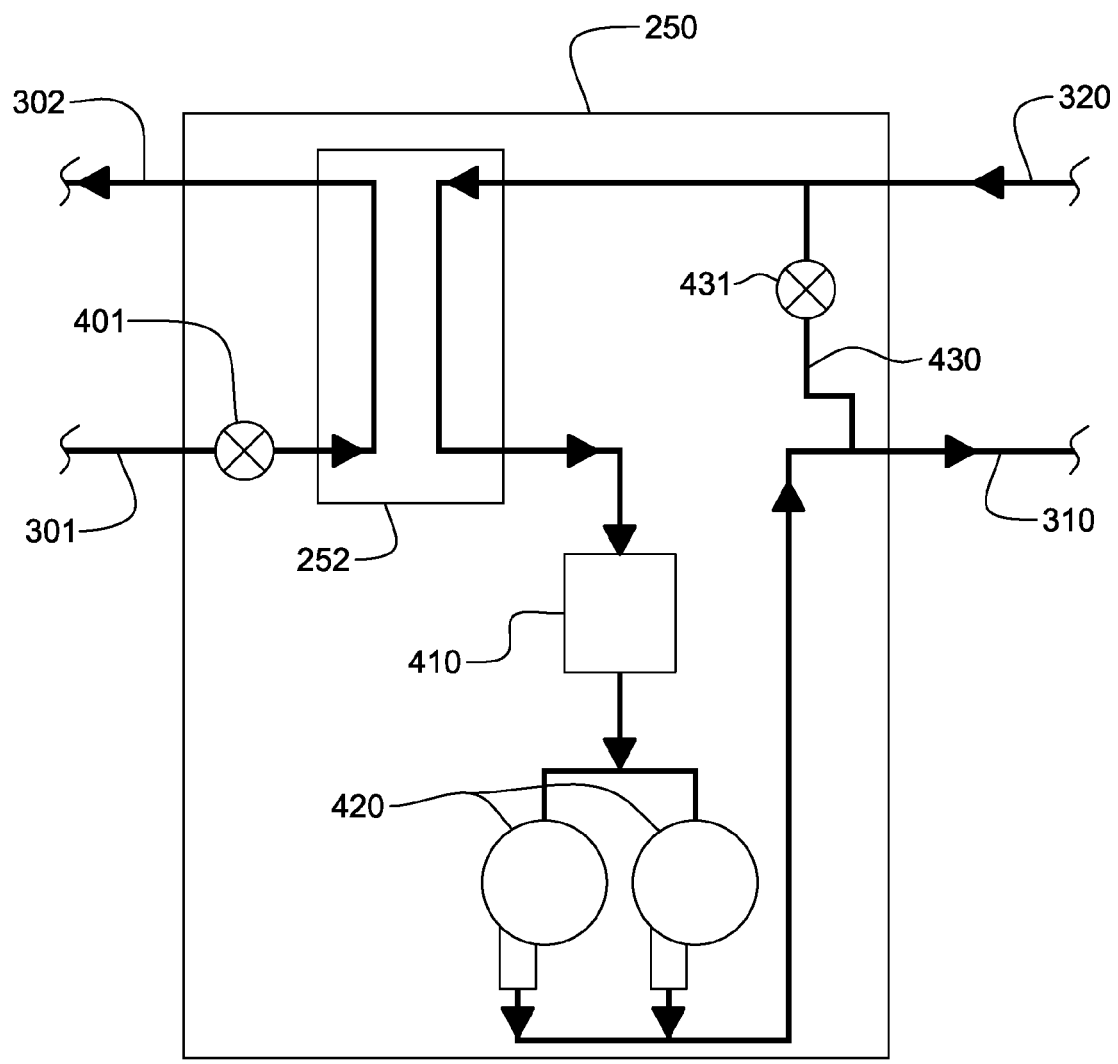
FIG. 4 is a schematic of one embodiment of a coolant distribution unit which may be employed (in one embodiment) in association with an air-cooling apparatus, in accordance with one or more aspects of the present invention.

FIG. 4 depicts one embodiment of a coolant distribution unit 250 for (for example) a data center such as depicted in FIG. 3. Liquid-to-liquid heat exchanger 252 cools system coolant passing through the system coolant loop (comprising system coolant supply header 310 and system coolant return header 320). In one embodiment, the system coolant has undergone heating (and possibly partial vaporization) within the respective air-to-liquid heat exchangers disposed within the outlet doors of the electronics racks. The facility coolant loop coupled to liquid-to-liquid heat exchanger 252 comprises facility coolant supply line 301 and facility coolant return line 302, which in one embodiment, provide chilled facility water to the liquid-to-liquid heat exchanger. A control valve 401 may be employed in facility coolant supply line 301 to control facility coolant flow rate through the liquid-to-liquid heat exchanger 252. After the system coolant cools within liquid-to-liquid heat exchanger 252, the coolant is collected in a reservoir 410 for pumping via a redundant pump assembly 420 back to the respective row of electronics racks via system coolant supply header 310. As shown in FIG. 4, a bypass line 430 with a bypass valve 431 may be employed to control the amount of system coolant fed back through the system coolant supply header, and hence, control temperature of system coolant delivered to the respective air-to-liquid heat exchangers mounted to the doors of the electronics racks.

Figure 5:
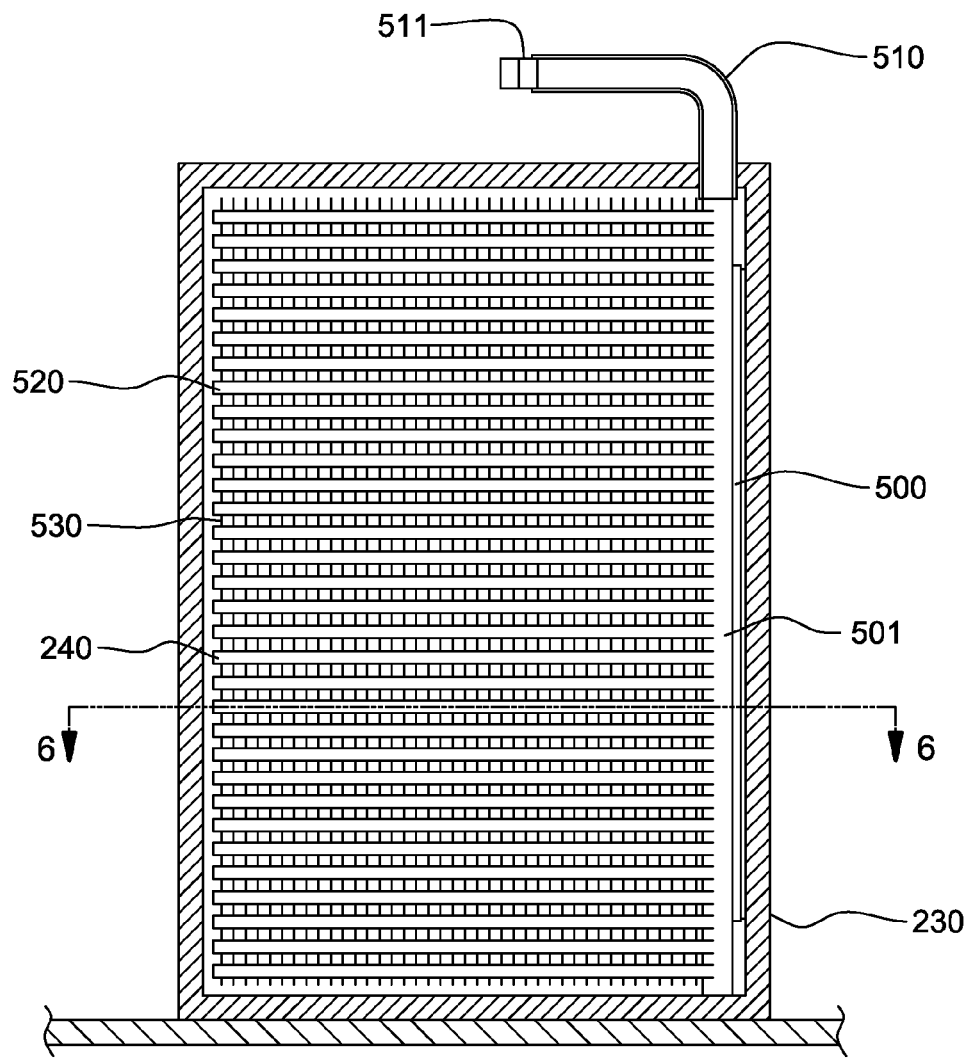
FIG. 5 is a partial cross-sectional elevational view of one embodiment of an electronic rack door with an air-to-liquid heat exchanger mounted thereto, taken along line 5-5 in FIG. 6, in accordance with one or more aspects of the present invention.
Figure 6:
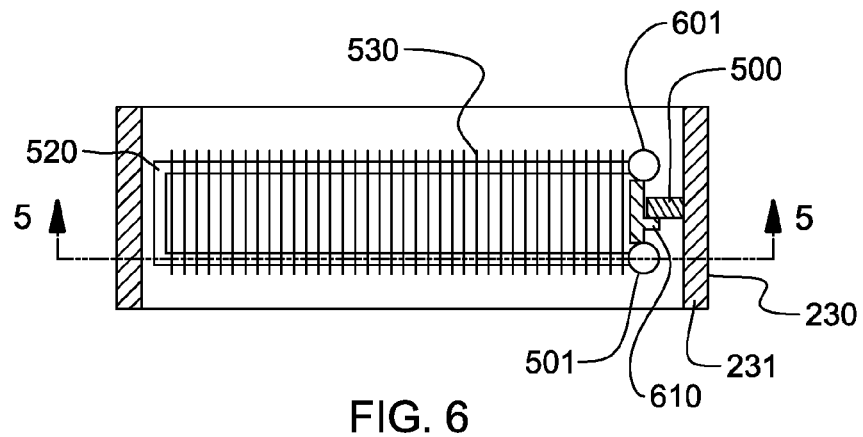
FIG. 6 is a cross-sectional, top plan view of the door and air-to-liquid heat exchanger of FIG. 5, taken along line 6-6 in FIG. 5, in accordance with one or more aspects of the present invention.

FIGS. 5 & 6 depict one embodiment of outlet door 230 supporting air-to-liquid heat exchanger 240, and system coolant inlet and outlet plenums 501, 601. Referring to both figures collectively, outlet door frame 231 supports a rigid flap 500, which attaches, for example, by brazing or soldering, to a plate 610 secured between the system coolant inlet plenum 501 and system coolant outlet plenum 601.

In FIG. 5, right angle bend 510 is shown disposed at the top of system coolant inlet plenum 501. This right angle bend defines a horizontal inlet plenum portion, which extends above the top of door 230. The coolant inlet to system coolant inlet plenum 501 is coupled to a connect coupling 511 for facilitating connection thereof to the respective supply hose, as described above. In this embodiment, the air-to-liquid heat exchanger comprises a plurality of horizontally-oriented heat exchange tube sections 520. These heat exchange tube sections 520 each comprise a coolant channel having an inlet and an outlet, with each coolant channel being coupled to the system coolant inlet plenum 501 and each coolant channel outlet being coupled to the system coolant outlet plenum 601. A plurality of fins 530 are attached to horizontally-oriented heat exchange tube sections 520 for facilitating transfer of heat from air passing across the air-to-liquid heat exchanger to coolant flowing through the plurality of heat exchange tube sections 520. In one embodiment, the plurality of fins are vertically-oriented, rectangular fins attached to horizontally-oriented heat exchange tube sections 520.

By way of specific example, FIGS. 7A & 7B depict one embodiment of an electronics rack door 700 with a cooling apparatus mounted thereto, which as explained below, may be configured and sized as a multi-rack door and heat exchanger, in accordance with one or more aspects of the present invention. This cooling apparatus includes an air-to-liquid heat exchanger 715 across which exhausting air from the air outlet side of the electronics rack(s) (not shown) flows. As illustrated, air-to-liquid heat exchanger 715 is disposed within an airflow opening in a door frame 710 which vertically mounts along a first edge 711 to the electronics rack(s) (or as explained below, an adapter frame holding multiple racks in fixed relation). The cooling apparatus includes a system coolant inlet plenum 720 and system coolant outlet plenum 725 which (in this embodiment) extend vertically into and along a second edge 712 of heat exchanger door 700. As illustrated, second edge 712 of heat exchanger door 700 is in opposing relation to first edge 711, which hingedly mounts to one or more electronics racks or adapter frames. Thus, in this embodiment, the system coolant inlet and outlet plenums 720, 725 are disposed remote from the edge of the heat exchanger door mounted to the electronics rack(s). This will advantageously reduce stress (in an overhead supply and return implementation) on the system coolant supply and return hoses, during opening or closing of the door, particularly when the first ends of the supply and return hoses are affixed in parallel relation on top of the rack door to extend towards the first edge of the rack door. As illustrated, system coolant inlet plenum 720 includes a coolant inlet 721 which has a connect coupling 722 for facilitating fluid tight connection to the system coolant supply hose (not shown). Similarly, system coolant outlet plenum 725 includes a coolant outlet 726 with a connect coupling 727 to facilitate fluid tight connection to a system coolant return hose. In one embodiment, these connect couplings are quick connect couplings such as the commercially available quick connect couplings offered by Colder Products Company, of St. Paul, Minn., U.S.A., or Parker Hannifin, of Cleveland, Ohio, U.S.A.

FIGS. 7A & 7B also illustrate one embodiment of a stress relief structure 730 attached to an upper surface 713 of door 700. Stress relief structure 730 includes a first opening 731 and a second opening 732 which are respectively configured to receive the system coolant supply hose and the system coolant return hose.

Figure 8:
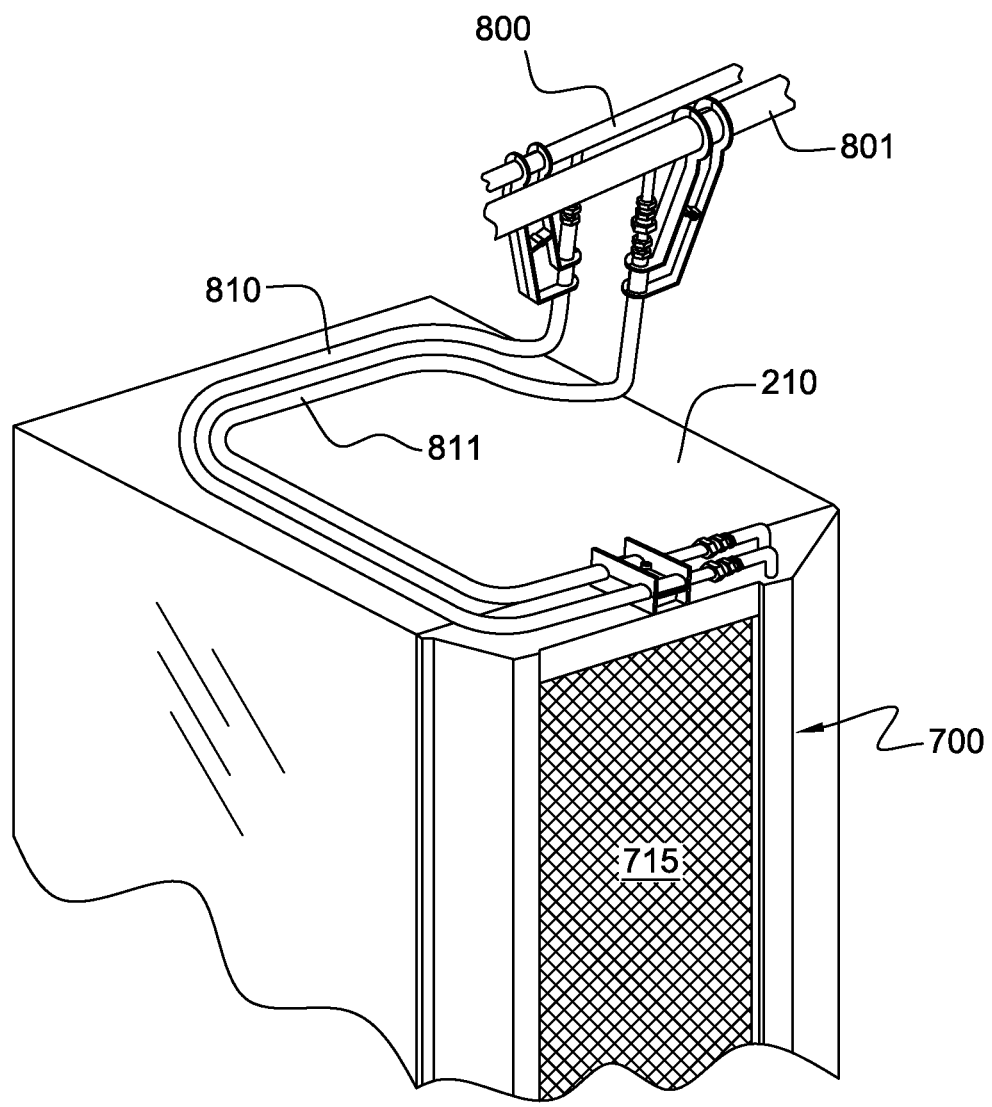
FIG. 8 is a partial isometric view of one embodiment of a single electronics rack, with an electronics rack door having an air-to-liquid heat exchanger, and illustrating coolant supply and return headers of a data center, in accordance with one or more aspects of the present invention.

FIG. 8 depicts one embodiment of electronics rack 210 comprising a hinged outlet door 700 with an air-to-liquid heat exchanger 715 disposed therein, and illustrating overhead system coolant supply and return headers 800, 801, respectively. As shown, system coolant supply and return hoses 810, 811 couple the air-to-liquid heat exchanger 715 in fluid communication with the system coolant supply and return headers 800, 801, respectively. In one embodiment, system coolant supply and return hoses 810, 811 are sufficiently sized to allow for translational and rotational movement of the hoses with opening or closing of the heat exchanger door 700. If desired, retention loops could be provided for constraining movement of the hoses at multiple locations on top of the electronics rack.

Those skilled in the art will note that the door, door frame and air-to-liquid heat exchanger embodiments depicted in FIGS. 2-8 are presented by way of example only. For example, a multi-rack door with a multi-rack, door-mounted heat exchanger, such as described hereinbelow, may be implemented with similar cooling structures such as those described above in connection with FIGS. 2-8, or in various alternate embodiments thereof. For instance, in one alternate embodiment, the system coolant supply and return manifolds could be disposed beneath the electronics racks in a raised floor data center. Further, the particular design of the air-to-liquid heat exchanger can vary without departing from the one or more aspects of the present invention disclosed herein.

Figure 9:
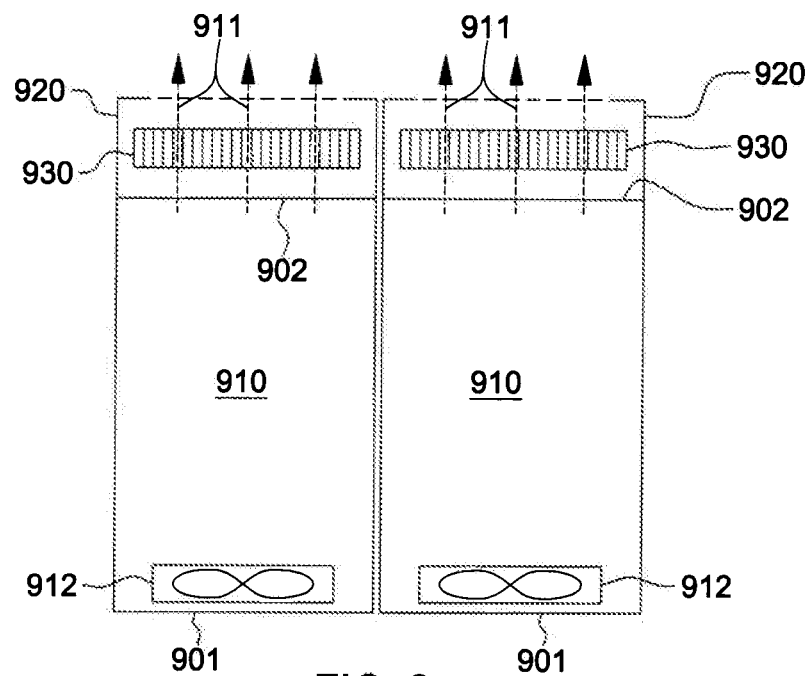
FIG. 9 depicts a data center comprising two separate electronics racks disposed adjacent to each other, each having a respective electronics rack door with an air-to-liquid heat exchanger.

FIG. 9 illustrates a generalized depiction of two adjacent electronics racks 910 disposed, for example, within a row of electronics racks within a data center. As in the above-described embodiments, each electronics rack 910 includes one or more air-moving devices 912 for moving air from an air inlet side 901 to an air outlet side 902 and across, for example, one or more electronic components (or systems) disposed within electronics rack 910 to be air-cooled. Heated airflow 911 egresses through the air outlet side of electronics rack 910 and into an outlet door 920 comprising an air-to-liquid heat exchanger 930. As described above, air-to-liquid heat exchanger 930 extracts heat from (in this example) the airflow 911 egressing from the air outlet side 902 of electronics rack 910. Although this cooling approach works well, and is in use in many data centers today, further enhancements in heat removal, energy efficiency and reduced hardware costs of the heat removal system are desired.

Thus, disclosed hereinbelow with reference to FIGS. 10-14 are various enhanced multi-rack assemblies (with multi-rack doors and multi-rack, door-mounted heat exchangers), in accordance with one or more aspects of the present invention. As explained below, the air-cooling apparatuses disclosed herein allow standard depth IT rack units to be assembled so that a single, door-mounted heat exchanger spans multiple racks for simultaneously cooling air ingressing into or egressing from the multiple electronics racks. More particularly, the apparatus disclosed herein enables two or more racks, including industry-standard electronics racks, to be mechanically coupled (or assembled) and cooled using a single, multi-rack door comprising a multi-rack, door-mounted heat exchanger. This multi-rack assembly improves energy efficiency and reduces costs of the heat exchange system in achieving heat removal from (for example) industry-standard IT racks. Advantageously, the apparatus disclosed herein can be retrofitted onto existing electronics racks within existing data centers, with little or no modification to the racks themselves. The apparatus disclosed herein can be applied to a variety of electronics racks, including industry-standard frames, and can even be applied to two or more frames of different widths and/or different depths. In addition, a lower airflow impedance is obtained by the air-cooling apparatus disclosed, compared with, for example, the above-described door-mounted air-to-liquid heat exchangers, which are dedicated to cooling airflow through a single electronics rack. This in turn enables improved performance, and greater robustness of the IT equipment cooling system. Advantageously, the multi-rack doors and multi-rack, door-mounted heat exchangers disclosed herein require fewer hoses and connections for supply and return of system coolant, and thus require less volume of coolant to be employed within the data center to achieve a given amount of heat removal. In addition, the air-cooling apparatuses disclosed achieve a higher increase in coolant temperature across the heat exchanger, thereby enabling more efficient heat transfer to the external environment, and allow an opportunity for a higher inlet coolant temperature, which can enable a chiller capacity reduction.

In accordance with aspects of the present invention, improvements in capacity for heat removal, energy efficiency and cost savings are accomplished by providing a multi-rack, door-mounted heat exchanger which provides, in one embodiment, a single air-to-liquid heat exchanger which spans the air inlet sides or the air outlet sides of multiple adjacent electronics racks. The multi-rack heat exchanger disclosed herein provides a higher percentage of effective heat exchanger surface area in opposing relation to the surface areas of the air inlet sides or the air outlet sides of two or more adjacent electronics racks being held in fixed relation adjacent to each other. In comparison to the multi-rack heat exchanger disclosed herein, dedicated door-mounted heat exchangers, such as depicted in FIG. 9, provide a smaller heat exchanger surface area, and the individual rack doors require substantial area which cannot be used for heat removal or for the airflow path due, for example, to space requirements for coil returns and the mechanical blockages inherent in the door frame. Cost improvements are achieved due to similar material and fabrication efficiencies of the air-cooling apparatus disclosed. Additionally, cost benefits are achieved by, for example, an at least approximately 50% reduction in the coolant delivery and return structures, including the door-mounted coolant inlet and outlet manifolds, and the coolant supply and return hoses.

Figure 10:
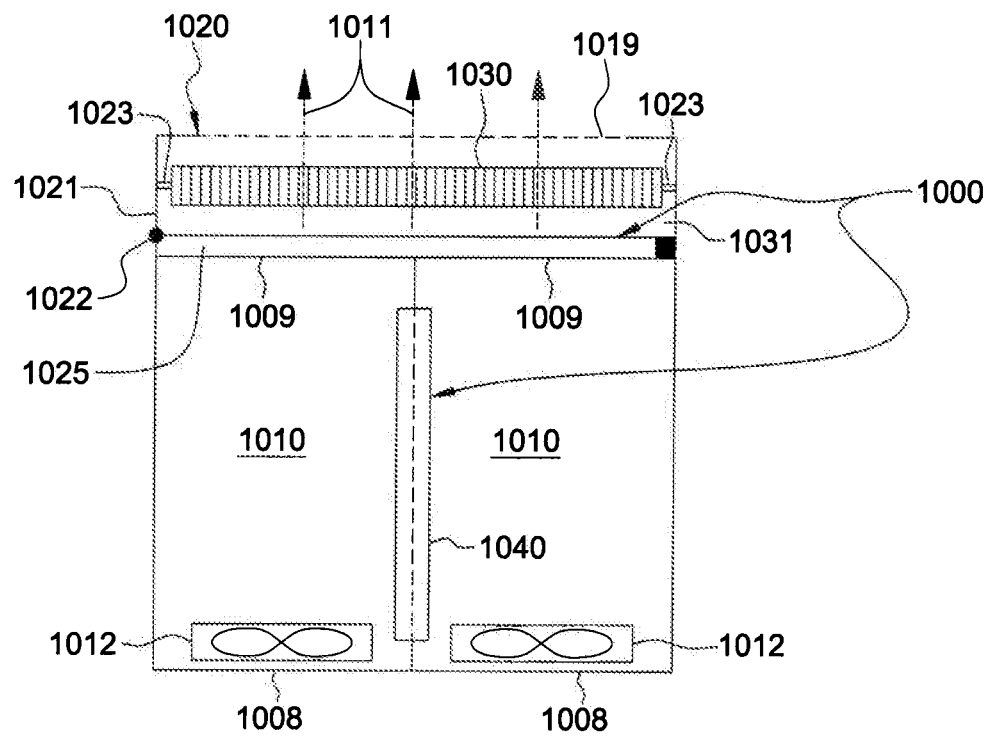
FIG. 10 depicts one embodiment of a multi-rack assembly comprising two separate electronics racks, held in fixed relation adjacent to each other, and illustrating one embodiment of an air-cooling apparatus, in accordance with one or more aspects of the present invention.

FIG. 10 depicts one embodiment of a multi-rack assembly, in accordance with one or more aspects of the present invention. As shown, the multi-rack assembly includes a multi-rack door 1020 mounted to (in this embodiment) two separate electronics racks 1010, which are held in fixed relation to each other via a securing mechanism 1000. The two separate electronics racks 1010 each comprise one or more air-moving devices 1012 (such as fans or blowers) for providing an external airflow 1011 through the electronics racks from air inlet sides 1008 to air outlet sides 1009 of the electronics racks. In one implementation, a door frame 1021 of multi-rack door 1020 includes an airflow opening 1019 which facilitates egress of the airflow 1011 passing through the two separate electronics racks 1010. Note that electronics racks 1010 are separate, stand-alone electronics racks, and may be one of a variety of conventionally available IT racks comprising one or more heat-generating electronic components (or systems) to be cooled. For example, standard, 24-inch wide IT racks, with a 40-inch depth, can be employed in the multi-rack assembly disclosed. Such racks can accommodate all depths of standard IT equipment, and can be installed through the typical door access available in today's data center. The apparatus disclosed herein provides a method to combine, for example, two or more standard IT racks together (after they are transported to the data center) for cooling, using a single, multi-rack, door-mounted heat exchanger. Further, although illustrated with respect to a two-rack assembly, the air-cooling apparatuses disclosed herein could be adapted to mount to three or more separate electronics racks employing, for example, an appropriately-configured securing mechanism and multi-rack door.

In the rack assembly embodiment of FIG. 10, the securing mechanism 1000 comprises an adapter frame 1025 mounted to air outlet sides 1009 of electronics racks 1010. As explained further below, adapter frame 1025 can be configured as a solid-walled flange or structural extender having (for example) a rectangular-shaped cross-section in a direction transverse to the direction of airflow through the electronics rack. In one implementation, structural extender 1025 forms an airtight seal, with the two separate electronics racks 1010 along upper, lower and side edges thereof at either the air inlet sides or the air outlet sides, with the air outlet side rack assembly being illustrated in FIG. 10 by way of example only. The frame adapter 1025 and multi-rack door 1020 together are configured to form a common airflow plenum 1031 between the air outlet sides 1009, door frame 1021, and air-to-liquid heat exchanger 1030 mounted within door frame 1021 of multi-rack door 1020. Adjustable ducting structures 1023 are provided within door frame 1021 to facilitate defining the common airflow plenum and ensuring that substantially all airflow passing through electronics racks 1010 passes across air-to-liquid heat exchanger 1030. As explained further below, adjustable ducting structures 1023 may comprise one or more expandable or telescoping ducting plates, which are configured and positioned to direct airflow 1011 to pass across air-to-liquid heat exchanger 1030. The air-to-liquid heat exchanger 1030 is supported by door frame 1021 and disposed so that air flowing through the airflow opening 1019 passes across air-to-liquid heat exchanger 1030. In operation, the air-to-liquid heat exchanger extracts heat from the air passing thereacross.

In the embodiment illustrated, multi-rack door 1020 is hingedly 1022 mounted along a vertical edge thereof to adapter frame 1025 of the securing mechanism 1000. As shown, securing mechanism 1000 further includes one or more slidable engagement structures 1040 disposed, for example, between the two or more separate electronics racks 1010 to facilitate holding the two separate electronics racks in fixed relation adjacent to each other. Slidable engagement structure 1040 allows, for example, a first electronics rack to be slideably positioned alongside and to be held adjacent to a second electronics rack for assembly into a multi-rack assembly using the air-cooling apparatus disclosed herein, as explained further below.

Figure 11:
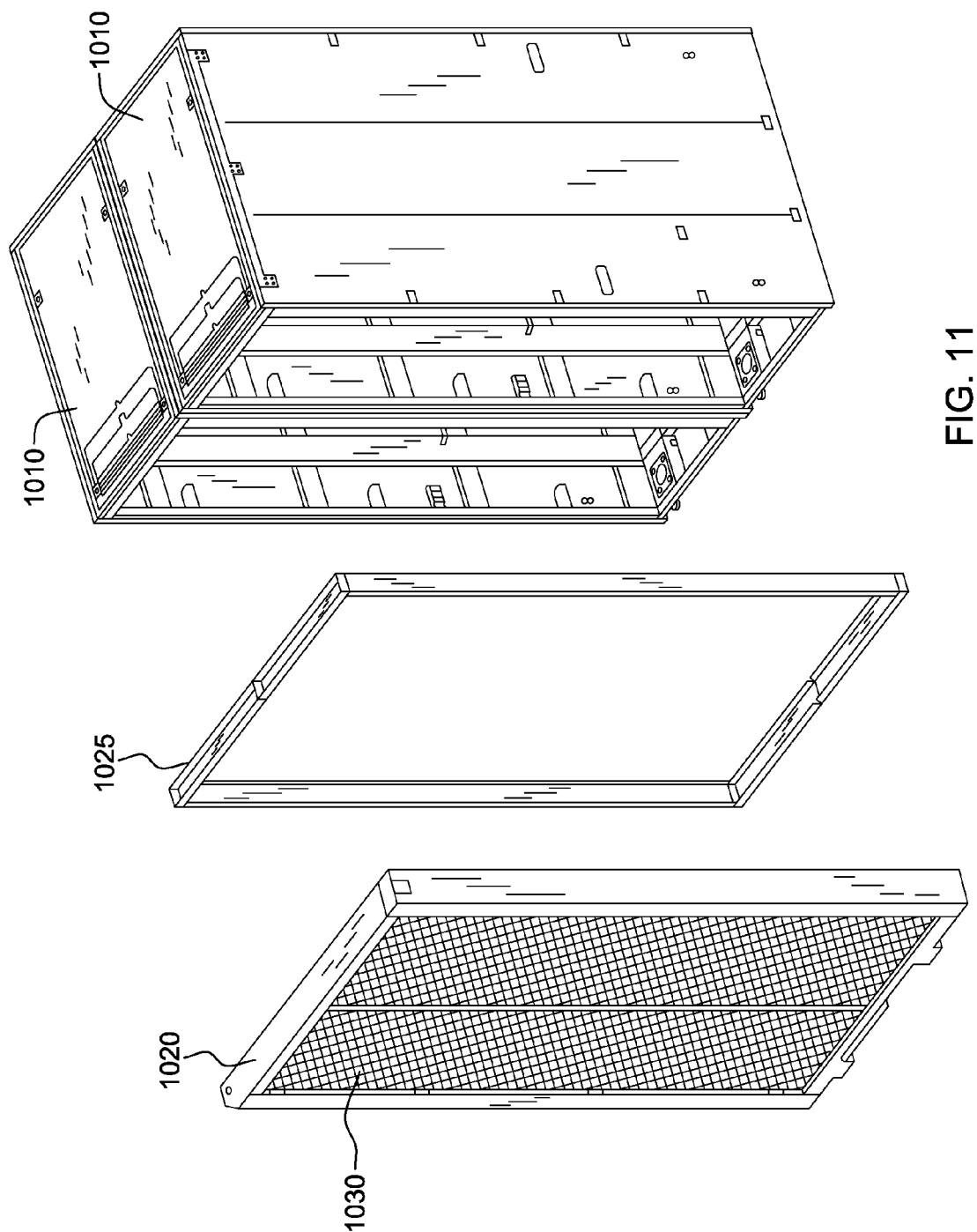
FIG. 11 is an exploded isometric view of one partial embodiment of the multi-rack assembly of FIG. 10, in accordance with one or more aspects of the present invention.

FIG. 11 illustrates an exploded view of a partial embodiment of multi-rack assembly, in accordance with one or more aspects of the present invention. As illustrated, two separate electronics racks 1010 are positioned adjacent to each other and are held in fixed relation to each other via an adapter frame 1025 configured to mount to (e.g., encircle) the edges of the two (or more) adjacent electronics racks along upper, lower and side edges thereof. Multi-rack door 1030 is sized and configured to mount to adapter frame 1025. Adapter frame 1025 provides, in one aspect, a mechanical structure for holding the two or more electronics racks together. Further, adapter frame 1025 forms a single vertical plane for the multi-rack door to mount to, and accommodates (in one embodiment) a hinge assembly and latching assembly which allow the multi-rack door to be latched closed or rotated open for access to, for example, the air inlet sides or the air outlet sides of the two or more adjacent electronics racks held in fixed relation adjacent to each other by the adapter frame. Rotating open the multi-rack door facilitates inspection or servicing of the electronics racks, or more particularly, the IT systems located within the two or more adjacently-held electronics racks.

In addition to an adapter frame 1025, the securing mechanism of the multi-rack assembly disclosed herein may include, in one embodiment, one or more mechanical devices to hold the opposite sides of the electronics racks from the adapter frame together to achieve the multi-rack assembly. These mechanical devices may include: nuts/bolts (where holes are available and appropriately placed in both electronics racks); clamps (where holes are unavailable); or cable loops with tightening mechanisms (which encompass, for example, the front sides or back sides of both racks), etc.

In an alternate embodiment, the multi-rack door 1020 and multi-rack, door-mounted heat exchanger 1030 may be mounted directly to, for example, the air outlet sides of the two or more adjacent electronics racks, with alternative securing mechanisms being provided than the adapter frame 1025 illustrated in FIGS. 10 & 11. In such embodiments, the electronics racks themselves could be configured to receive the multi-rack door via, for example, hinged mounting of the door directly to one of the electronics racks. Although not shown, the multi-rack door 1020 includes coolant inlet and outlet manifolds and hose attachments, as described above with respect to the door-mounted heat exchangers depicted in FIGS. 2-8. As noted above, the coolant may comprise a variety of types of coolant such as water or a refrigerant, selected to optimally extract heat from air passing through the two or more separate electronics racks held in fixed relation to each other by the securing mechanism of the apparatus. Further, the coolant supply and return hoses may couple the coolant inlet and outlet manifolds within the multi-rack door to coolant supply and return headers disposed above the electronics racks, or coolant supply and return plenums disposed, for example, in a supply air plenum below a raised floor supporting the electronics racks.

FIGS. 12A-12D depicts further details of the air-cooling apparatus and multi-rack assembly disclosed herein. In FIG. 12A, an assembly is shown wherein adapter frame 1025 is affixed to, for example, the air outlet side 1009 of a first electronics rack 1010, and slidable engagement structure 1040 has been mounted to one side of electronics rack 1010. In addition, the multi-rack door 1020 is shown being attached to adapter frame 1025 via hinged mounting assemblies 1022. Multi-rack door 1020 includes a door frame 1021 having an airflow opening 1019. Within door frame 1021, an air-to-liquid heat exchanger 1030 is supported and disposed so that air flowing through airflow opening 1019 passes across air-to-liquid heat exchanger 1030, with air-to-liquid heat exchanger 1030 extracting heat from the air passing thereacross. Air-to-liquid heat exchanger 1030 and airflow opening 1019 are sized and configured so that substantially all air passing through the air inlet sides or the air outlet sides of the two or more separate electronics racks 1010 passes across the air-to-liquid heat exchanger 1030. In one embodiment, adjustable ducting structure 1023 within multi-rack door 1020 facilitates directing airflow across air-to-liquid heat exchanger 1030. As noted above, coolant inlet and outlet manifolds and coolant supply and return hoses coupled to the manifolds are also associated with multi-rack door 1020. Further, multi-rack door 1020 includes, in one embodiment, a sealing gasket to seal the door to adapter frame 1025, and a latch mechanism 1200 for latching the multi-rack door to adapter frame 1025.

In FIG. 12B, the multi-rack door has been hingedly 1022 mounted to adapter frame 1025, and in FIG. 12C, a second electronics rack 1010 is shown being slid into position alongside the first electronics rack 1010, having the slidable engagement structure 1040 mounted to the side thereof. In one embodiment, slidable engagement structure 1040 may comprise a T-shaped structure, with flanges extending over the top surfaces of the electronics racks 1010 to facilitate securing of the slidable engagement structure to the respective electronics racks. Those skilled in the art will note that other configurations of the slidable engagement structure may also be employed for positioning and holding the adjacent electronics racks in fixed relation to each other.

Figure 12E:
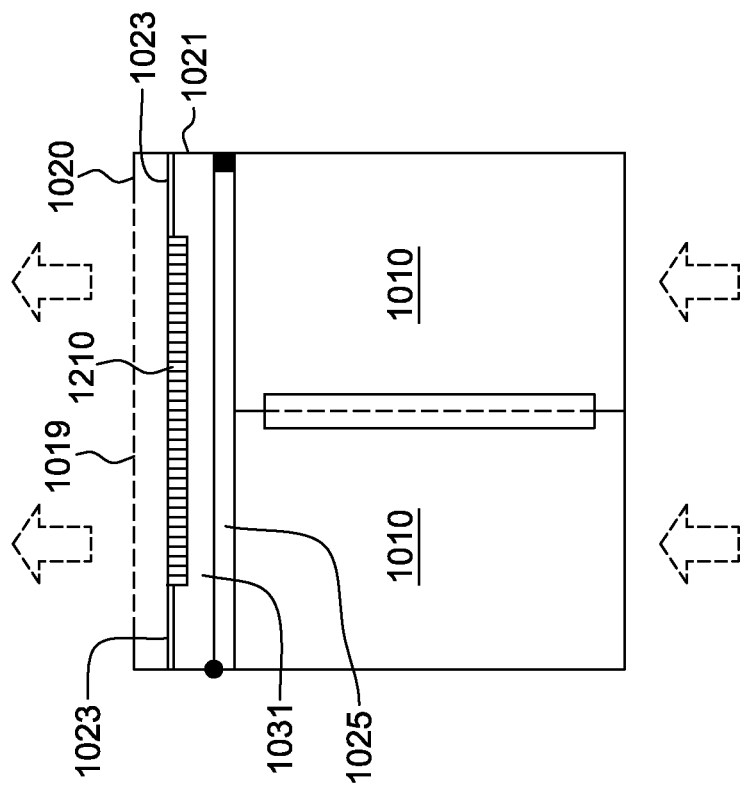
FIG. 12E depicts a variation on the multi-rack assembly of FIG. 12D, wherein adjustable ducting structures are provided within the multi-rack door to accommodate a smaller-sized, air-to-liquid heat exchanger within the door, while ensuring that substantially all air passing through the air outlet sides of the two separate electronics racks passes across the smaller-sized, air-to-liquid heat exchanger, in accordance with one or more aspects of the present invention.
Figure 12D:
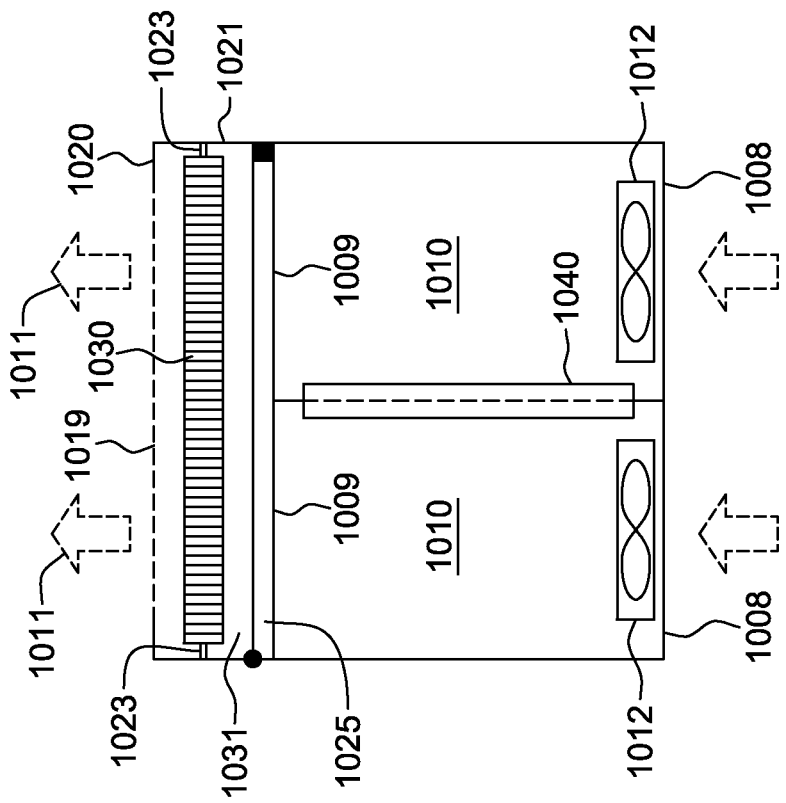
FIG. 12D depicts the multi-rack assembly of FIG. 12C, with the first electronics rack and second electronics rack shown held in fixed relation adjacent to each other, and the adapter frame defining a common airflow plenum directing air egressing from the first electronics rack and from the second electronics rack to pass through the multi-rack, door-mounted heat exchanger, in accordance with one or more aspects of the present invention.

In FIG. 12D, the two separate electronics racks 1010 are shown disposed in fixed relation, and held in position by the adapter frame 1025 and slidable engagement structure 1040, as well as possibly other mechanical securing devices (such as described above) mounted, for example, to the air inlet and/or the air outlet sides of electronics racks 1010. Electronics racks 1010 include one or more air-moving devices 1012, which establish airflow 1011 through electronics racks 1010 that is exhausted out through multi-rack door 1020, and in particular, across air-to-liquid heat exchanger 1030 through airflow opening 1019. As explained above, air-to-liquid heat exchanger 1030 extracts heat from the airflow 1011 passing thereacross. Multi-rack door 1020 and adapter frame 1025 define a common airflow plenum 1031 between air outlet sides 1009 of electronics racks 1010 and air-to-liquid heat exchanger 1030. Adjustable ducting structures 1023 within multi-rack door 1020 facilitate defining this common airflow plenum 1031 and ensure that substantially all airflow 1011 passing through electronics racks 1010 passes across air-to-liquid heat exchanger 1030. As illustrated, air-to-liquid heat exchanger 1030 and structures 1023 are sized such that substantially all air passing through airflow opening 1019 passes across the air-to-liquid heat exchanger 1030.

In the alternate multi-rack assembly of FIG. 12E, the two or more separate electronics racks held in fixed relation adjacent to each other are assumed to produce less heat than in the example of FIGS. 12A-12D. In such a case, a smaller air-to-liquid heat exchanger 1210 may be mounted within door frame 1021 of multi-rack door 1020. In this embodiment, the airflow opening 1019 in door frame 1021 is substantially the same as in the multi-rack door 1020 of FIGS. 12A-12D. However, adjustable ducting structures 1023 are expanded or telescoped to accommodate the smaller air-to-liquid heat exchanger 1210 disposed within door frame 1021. The adjustable ducting is expanded to ensure that substantially all air passing through the electronics racks 1010 passes across the smaller air-to-liquid heat exchanger 1210. Other than being smaller (e.g., to accommodate a smaller heat load), air-to-liquid heat exchanger 1210 is similar to air-to-liquid heat exchanger 1030 described above and may be, in one embodiment, an air-to-liquid heat exchanger such as depicted and described above in connection with FIGS. 2-8. Note also that adjustable ducting structures 1023 may comprise slidable wall structures which may be expanded or retracted depending upon the size of the air-to-liquid heat exchanger mounted within the door frame. Thus, the air-to-liquid heat exchanger may be selectively sized for the heat load of the particular electronics racks held in fixed relation within the multi-rack assembly. Advantageously, the same multi-rack door may thus be used with different air-to-liquid heat exchangers.

This concept is also illustrated in FIGS. 13A & 13B, wherein in FIG. 13A, a larger air-to-liquid heat exchanger 1030 is shown disposed within door frame 1021 of multi-rack door 1020, and in FIG. 13B, a smaller version of the air-to-liquid heat exchanger 1210 is shown disposed within door frame 1021 of multi-rack door 1020, with adjustable ducting structures 1023 being appropriately configured or adjusted to ensure that substantially all airflow through the two or more separate electronics racks passes through the air-to-liquid heat exchanger.

In the embodiments of FIGS. 13A & 13B, a first electronics rack 1300 is shown to be of less depth than a second electronics rack 1010. In this case, the electronics racks may have the same heat load, or different heat loads. As illustrated, a filler structure (or flange) 1310 is configured and sized to extend the depth of first electronics rack 1300 to substantially equal the depth of the second electronics rack 1010. This filler structure comprises, in one embodiment, a rectangular-shaped wall structure which has solid upper, lower and side walls, that essentially extend the common airflow plenum 1031 to air outlet side 1309 of first electronics rack 1300 being held in fixed relation adjacent to second electronics rack 1010. Filler structure 1310 also facilitates establishing a co-planar edge for adapter frame 1025 to mount to, notwithstanding the differently-sized electronics racks.

Figure 14:
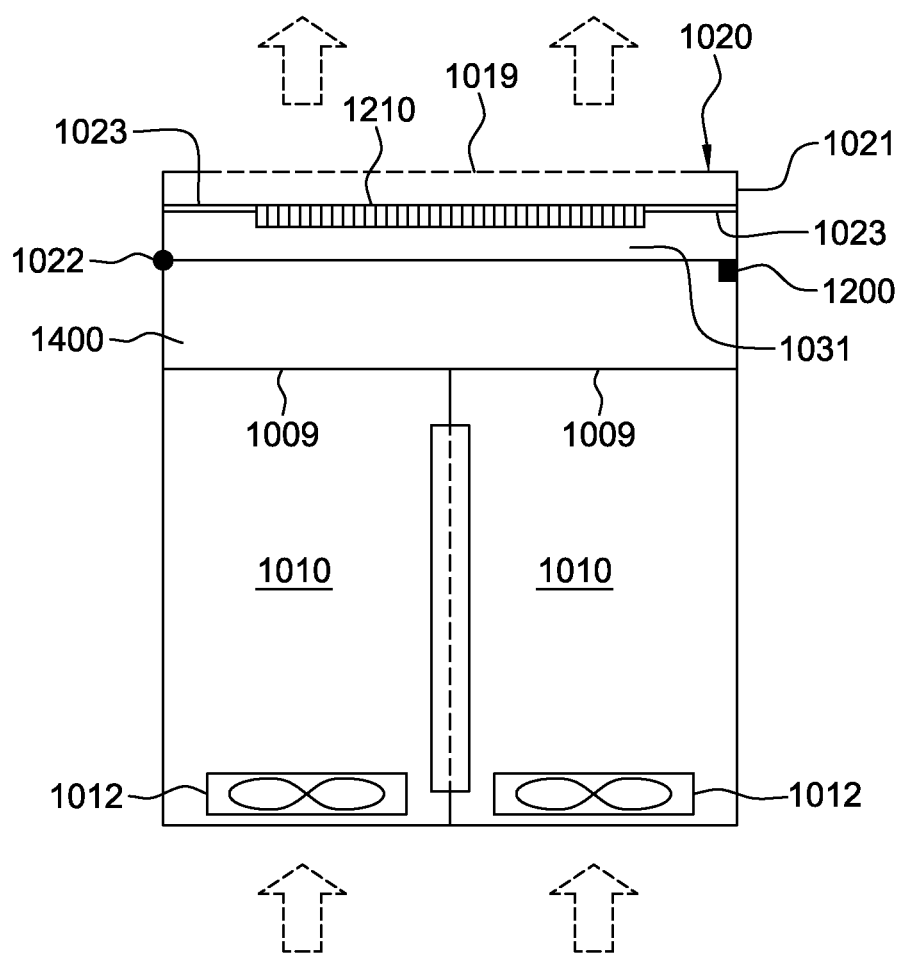
FIG. 14 depicts an alternate embodiment of the multi-rack assembly of FIGS. 10-12E, wherein the adapter frame holding the at least two separate electronics racks in fixed relation adjacent to each other has a depth greater than a depth of the multi-rack door in a direction of airflow through the two racks, thereby defining a larger, common airflow plenum between (in this example) the air outlet sides of the electronics racks and the multi-rack, door-mounted heat exchanger, in accordance with one or more aspects of the present invention.

In FIG. 14, an adapter frame 1400 is shown having a larger depth to create a larger common airflow plenum 1031 between the air outlet sides 1009 of the adjacently-held electronics racks 1010 and air-to-liquid heat exchanger 1210. One or more air-moving devices 1012 facilitate airflow through the adjacently-held electronics rack 1010, with air exhausting from the air outlet sides 1009 into the common airflow plenum 1031, passing across air-to-liquid heat exchanger 1210 and existing through airflow opening 1019 in door frame 1021 of multi-rack door 1020. In this embodiment, multi-rack door 1020 hingedly 1022 mounts along one vertical edge to adapter frame 1400, and latches 1200 at an opposite edge to adapter frame 1400. In one embodiment, adapter frame 1400 has a larger depth than a depth of the multi-rack door 1020 in a direction of airflow through the two separate electronics racks 1010.

Advantageously, disclosed herein is a cooling apparatus which includes a multi-rack door that attaches to two or more slideably engaged electronics racks housing one or more heat-generating electronic systems or components with the same or variable heat load. The multi-rack door incorporates an air-to-liquid heat exchanger for cooling the heat load of the electronics racks to which the multi-rack door is attached, either at the air inlet side or the air outlet side of the racks. A securing mechanism is provided which holds the electronics racks in fixed relation to each other, with the air inlet sides facing a first direction and the air outlet sides facing a second direction. The securing mechanism includes an adapter frame to which the multi-rack door hingedly mounts. The adapter frame may be employed with a filler structure to allow the multi-rack door to mount to differently-sized electronics racks, which helps to optimize airflow and heat removal from the multi-rack assembly. For example, where two shallow-depth heat exchangers are to be secured for cooling using a multi-rack door, the adapter frame (and optionally, the filler structure) facilitates co-planarity of the resulting rack assembly with other racks in the data center, thereby helping the resultant aisle configuration to be geometrically aligned at the data center level. Further, internal adaptable structures, such as adjustable ducting structures, are provided to accommodate different-sized heat exchangers within the multi-rack door. These adjustable structures preferentially position the air-to-liquid heat exchanger within the door frame, and facilitate defining a common airflow plenum to direct the airflow across the air-to-liquid heat exchanger.

Those skilled in the art will note from the above description that the multi-rack, door-mounted heat exchanger of the air-cooling apparatus disclosed herein has (in one embodiment)

a larger surface area than the surface areas of the individual air inlet sides or air outlet sides of the electronics racks held in opposing relation therewith. The multi-rack door and air-to-liquid heat exchanger disclosed herein advantageously provide a high-heat capacity heat removal, a high-efficiency heat removal, a lower cost, and support standard IT electronics racks. The air-cooling apparatus disclosed can be readily retrofitted to two or more electronics racks within a data center, and the air-to-liquid heat exchanger size can be tailored to optimize heat removal for the multi-rack assembly. Differently-sized air-to-liquid heat exchangers may be employed within the multi-rack door to effectively tailor the cooling required dependent on the heat load of the two or more separate electronics racks being cooled. The result is a more efficient coolant distribution to the areas of the data center where the heat transfer occurs, with more width in the door being devoted to heat transfer than compared with dedicated air-to-liquid heat exchangers per electronics racks, as described above. This also results in a lower pressure drop through the air-to-liquid heat exchanger due to less restriction to airflow, meaning (in one embodiment) that lower-speed air-moving devices may be employed within the electronics racks. Using the adjustable ducting structures disclosed herein, the differently-dimensioned air-to-liquid heat exchangers may be separately accommodated within the multi-rack doors (thus enabling cooling to be tailored to the particular electronics racks). In addition, the air-cooling apparatus disclosed herein can be disassembled from the electronics racks when desired, for example, for reconfiguration of the data center.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. An air-cooling apparatus comprising:
a securing mechanism for holding at least two separate electronics racks in fixed relation adjacent to each other, the at least two separate electronics racks each being an independent, free standing electronics rack and being at least partially air-cooled and each having an air inlet side and an air outlet side, and opposite sidewalls disposed between the air inlet side and the air outlet side thereof, the securing mechanism holding the at least two separate electronics racks in fixed relation adjacent to each other with the air inlet sides facing a first direction, the air outlet sides facing a second direction, and with adjacent sidewalls thereof disposed directly adjacent to each other, the securing mechanism comprising:
an adapter frame mounted to the at least two separate electronics racks at the one of the air inlet sides or the outlet sides thereof, and holding the at least two separate electronics racks in fixed relation adjacent to each other, wherein the adapter frame comprises a rigid structural extender mounted to the at least two separate electronics racks at the one of the air inlet sides or the air outlet thereof; and
a multi-rack door spanning one of the air inlet sides or the air outlet sides of the at least two separate electronics racks held by the securing mechanism in fixed relation, the multi-rack door being hingedly mounted to the rigid structural extender of the adapter frame and comprising:
a door frame with an airflow opening, the airflow opening facilitating the ingress or egress of airflow through the at least two separate electronics racks;
an air-to-liquid heat exchanger supported by the door frame and disposed so that airflow through the airflow opening passes across the air-to-liquid heat exchanger, the air-to-liquid heat exchanger extracting heat from the airflow passing thereacross, and wherein air passing through the one of the air inlet sides or the air outlet sides of the at least two separate electronics racks passes across the air-to-liquid heat exchanger; and
wherein the rigid structural extender to which the multi-rack door is hingedly mounted defines a common airflow plenum between the one of the air inlet sides or the air outlet sides of the at least two separate electronics racks and the air-to-liquid heat exchanger of the multi-rack door.

2. The air-cooling apparatus of claim 1, wherein the structural extender has a rectangular-shaped cross-section transverse to a direction of airflow through the at least two separate electronics racks, and is configured to form an airtight seal with the at least two separate electronics racks along upper, lower, and side edges thereof at the one of the air inlet sides or the air outlet sides of the at least two separate electronics racks, and wherein the structural extender defining the common airflow plenum is configured to ensure that substantially all air passing through the one of the air inlet sides or the air outlet sides of the at least two separate electronics racks passes across the air-to-liquid heat exchanger.

3. The air-cooling apparatus of claim 1, wherein the multi-rack door further comprises an adjustable ducting structure disposed between the door frame and the air-to-liquid heat exchanger, the adjustable ducting structure facilitating ensuring that substantially all air passing through the one of the air inlet sides or the air outlet sides of the at least two separate electronics racks passes across the air-to-liquid heat exchanger.

4. The air-cooling apparatus of claim 1, wherein the air-to-liquid heat exchanger is in spaced, opposing relation to the one of the air inlet sides or the air outlet sides of the at least two separate electronics racks held by the securing mechanism in fixed relation, and the air-to-liquid heat exchanger has a larger surface area than a surface area of the air inlet side or air outlet side in spaced, opposing relation therewith of each of the at least two separate electronics racks.

5. A multi-rack assembly comprising:
a first electronics rack comprising at least one heat-generating electronic component, the first electronics rack being a first independent, free-standing electronics rack and comprising an air inlet side and an air outlet side respectively enabling ingress and egress of external air, and opposite sidewalls disposed between the air inlet side and the air outlet side thereof;
a second electronics rack comprising at least one heat-generating electronic component, the second electronics rack being a second independent, free-standing electronics rack and comprising an air inlet side and an air outlet side respectively enabling ingress and egress of external air, and opposite sidewalls disposed between the air inlet side and the air outlet side thereof;
an air-cooling apparatus for extracting heat from airflow passing through the first electronics rack and the second electronics rack, the apparatus comprising:
a securing mechanism for holding the first electronics rack and the second electronics rack in fixed relation adjacent to each other, the securing mechanism holding the first electronics rack and the second electronics rack in fixed relation adjacent to each other with the air inlet sides facing a first direction, the air outlet sides facing a second direction, and with adjacent sidewalls thereof disposed directly adjacent to each other, the securing mechanism comprising:
an adapter frame mounted to the first and second electronics racks at the one of the air inlet sides or the air outlet sides thereof, and holding the first and second electronics racks in fixed relation adjacent to each other, wherein the adapter frame comprises a rigid structural extender mounted to the first and second electronics racks at the one of the air inlet sides or the air outlet sides thereof; and
a multi-rack door spanning one of the air inlet sides or the air outlet sides of the first and second electronics racks held by the securing mechanism in fixed relation, the multi-rack door hingedly mounted to the rigid structural extender of the adapter frame and comprising:
a door frame with an airflow opening, the airflow opening facilitating the ingress or egress of airflow through the first and second electronics racks;
an air-to-liquid heat exchanger supported by the door frame and disposed so that airflow through the airflow opening passes across the air-to-liquid heat exchanger, the air-to-liquid heat exchanger extracting heat from the airflow passing thereacross, and wherein air passing through the one of the air inlet sides or the air outlet sides of the first and second electronics racks passes across the air-to-liquid heat exchanger; and
wherein the rigid structural extender to which the multi-rack door is hingedly mounted defines a common airflow plenum between the one of the air inlet sides or the air outlet sides of the at least two separate electronics racks and the air-to-liquid heat exchanger of the multi-rack door.

6. The multi-rack assembly of claim 5, wherein the structural extender has a rectangular-shaped cross-section transverse to a direction of airflow through the first and second electronics racks, and is configured to form an airtight seal with the first and second electronics racks along upper, lower, and side edges thereof at the one of the air inlet sides or the air outlet sides of the first and second electronics racks, and wherein the structural extender facilitating defining the common airflow plenum is configured to ensure that substantially all air passing through the one of the air inlet sides or the air outlet sides of the first and second electronics racks passes across the air-to-liquid heat exchanger.

7. The multi-rack assembly of claim 5, wherein the multi-rack door further comprises an adjustable ducting structure disposed between the door frame and the air-to-liquid heat exchanger, the adjustable ducting structure facilitating ensuring that substantially all air passing through the one of the air inlet sides or the air outlet sides of the first and second electronics racks passes across the air-to-liquid heat exchanger.

8. A method comprising:
providing a securing mechanism for holding at least two separate electronics racks in fixed relation adjacent to each other, the at least two separate electronics racks each being an independent, freestanding electronics rack and being at least partially air-cooled, and each having an air inlet side and an air outlet side and two opposite sidewalls disposed between the air inlet side and the air outlet side thereof, the securing mechanism holding the at least two separate electronics racks in fixed relation adjacent to each other with the air inlet sides facing a first direction and the air outlet sides facing a second direction and with adjacent sidewalls thereof disposed directly adjacent to each other, the securing mechanism comprising:
an adapter frame mounted to the at least two separate electronics racks at the one of the air inlet sides or the outlet sides thereof, and holding the at least two separate electronics racks in fixed relation adjacent to each other, wherein the adapter frame comprises a rigid structure extender mounted to the at least two separate electronics racks at the one of the air inlet sides or the air outlet sides thereof; and
providing a multi-rack door spanning one of the air inlet sides or the air outlet sides of the at least two separate electronics racks held by the securing mechanism in fixed relation, the multi-rack door being hingedly mounted to the rigid structural extender of the adapter frame and comprising:
a door frame with an airflow opening, the airflow opening facilitating the ingress and egress of airflow through the at least two separate electronics racks;
an air-to-liquid heat exchanger supported by the door frame and disposed so that airflow through the airflow opening passes across the air-to-liquid heat exchanger, the air-to-liquid heat exchanger extracting heat from the airflow passing thereacross, and wherein air passing through the one of the air inlet sides or the air outlet sides of the at least two separate electronics racks passes across the air-to-liquid heat exchanger; and
wherein the rigid structural extender to which the multi-rack door is hingedly mounted defines a common airflow plenum between the one of the air inlet sides or the air outlet sides of the at least two separate electronics racks and the air-to-liquid heat exchanger of the multi-rack door.

* * * * *